(12) United States Patent
Kaneko et al.

(10) Patent No.: US 11,249,126 B2
(45) Date of Patent: Feb. 15, 2022

(54) METHOD OF DETERMINING CORRECTION FUNCTION

(71) Applicant: Tokyo Electron Limited, Tokyo (JP)

(72) Inventors: Kazushi Kaneko, Miyagi (JP); Yohei Ishida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 50 days.

(21) Appl. No.: 16/848,483

(22) Filed: Apr. 14, 2020

(65) Prior Publication Data

US 2020/0341043 A1   Oct. 29, 2020

(30) Foreign Application Priority Data

Apr. 23, 2019 (JP) .............................. JP2019-082208

(51) Int. Cl.
| | | |
|---|---|---|
| *G01R 31/00* | (2006.01) | |
| *G01R 29/02* | (2006.01) | |
| *G01R 29/08* | (2006.01) | |
| *H03K 3/017* | (2006.01) | |

(52) U.S. Cl.
CPC ....... *G01R 29/023* (2013.01); *G01R 29/0892* (2013.01); *H03K 3/017* (2013.01)

(58) Field of Classification Search
USPC ................................................ 324/637–646
See application file for complete search history.

(56) References Cited

U.S. PATENT DOCUMENTS 4,290,009 A * 9/1981 Sanpei .................. G01R 27/04
324/608

FOREIGN PATENT DOCUMENTS

| JP | H06-267900 A | 9/1994 |
| JP | 2012-109080 A | 6/2012 |

* cited by examiner

*Primary Examiner* — Vincent Q Nguyen
(74) *Attorney, Agent, or Firm* — Studebaker & Brackett PC

(57) ABSTRACT

A method includes measuring first travelling wave power of a microwave having a single frequency peak and second travelling wave power having a single frequency peak, acquiring duty ratios of the first travelling wave power and the second travelling wave power based on measured values and a first determination threshold value, measuring third travelling wave power of a microwave having a bandwidth and fourth travelling wave power having a bandwidth, acquiring duty ratios of the third travelling wave power and the fourth travelling wave power based on measured values and a second determination threshold value, approximating a pulse width error between the first travelling wave power and the third travelling wave power and a pulse width error between the second travelling wave power and the fourth travelling wave power with linear functions, and determining the correction function based on the linear functions.

2 Claims, 18 Drawing Sheets

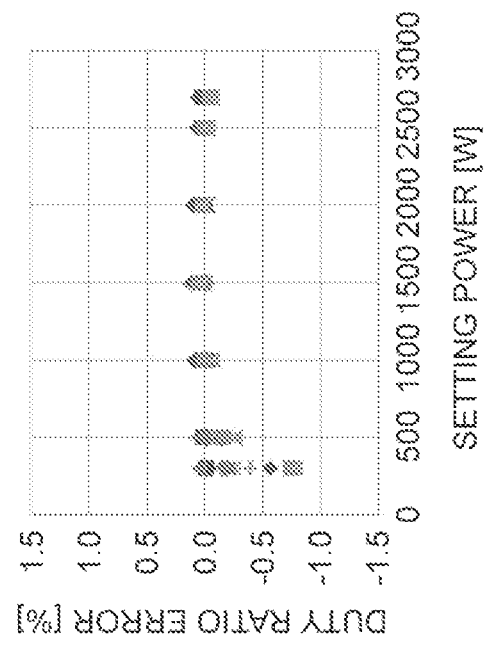
Fig. 18A
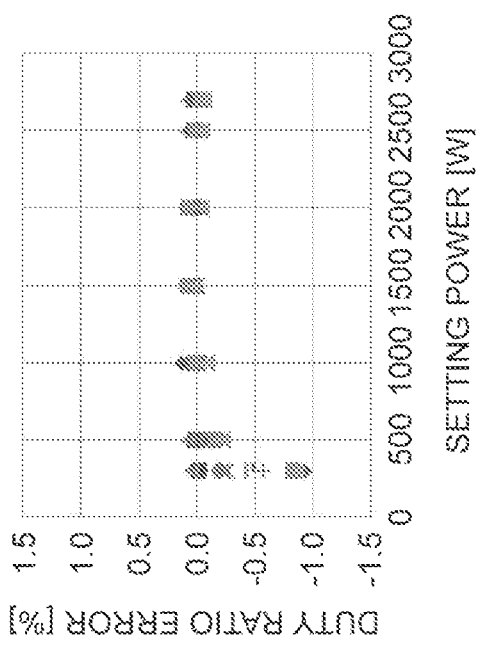
Fig. 18C
Fig. 18B
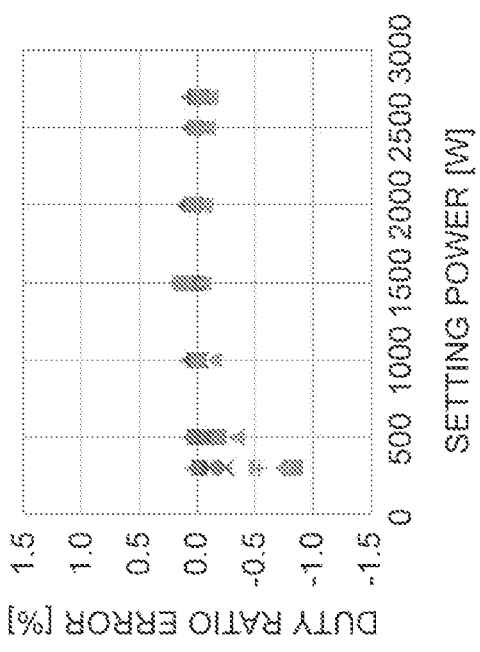
Fig. 18D

METHOD OF DETERMINING CORRECTION FUNCTION

CROSS-REFERENCE TO RELATED APPLICATIONS

This application is based on and claims the benefit of priority from Japanese Patent Application No. 2019-082208 filed on Apr. 23, 2019, and the entire contents of which are incorporated herein by reference.

TECHNICAL FIELD

The present disclosure relates to a method of determining a correction function.

BACKGROUND

Japanese Unexamined Patent Publication No. 2012-109080 discloses a plasma processing apparatus using microwaves. The plasma processing apparatus includes a microwave output device outputting a microwave having a bandwidth. The apparatus can stabilize plasma by outputting the microwave having a bandwidth. Japanese Unexamined Patent Publication No. H6-267900 discloses an apparatus which pulse-modulates a microwave for exciting plasma. This apparatus can prevent instability of plasma so as to reduce an electron temperature and an ion temperature.

SUMMARY

In an exemplary embodiment, a method of determining a correction function is provided. The correction function is used to correct a measurement result from a wave detector measuring a microwave which is pulse-modulated such that power thereof is turned on and off. The method includes a first measurement step, a first acquisition step, a second measurement step, a second acquisition step, and an approximation step, and a determination step. In the first measurement step, first travelling wave power and second travelling wave power of a microwave are measured by using a calibration measuring device. The first travelling wave power is power of a microwave having a single frequency peak, and is pulse-modulated such that an ON level corresponds to first setting power. The second travelling wave power is power of a microwave having a single frequency peak, and is pulse-modulated such that an ON level corresponds to second setting power. In the first acquisition step, a duty ratio of the first travelling wave power and a duty ratio of the second travelling wave power are acquired on the basis of measured values in the first measurement step and a first determination threshold value for determining an ON level of power. In the second measurement step, third travelling wave power and fourth travelling wave power of a microwave are measured by using a wave detector. The third travelling wave power is power of a microwave having a center frequency and a bandwidth, and is pulse-modulated such that an ON level corresponds to the first setting power. The fourth travelling wave power is power of a microwave having a center frequency and a bandwidth, and is pulse-modulated such that an ON level corresponds to the second setting power. In the second acquisition step, a duty ratio of the third travelling wave power and a duty ratio of the fourth travelling wave power are acquired on the basis of measured values in the second measurement step and a second determination threshold value, set in advance in a range more than 0% of the setting power and less than 50% of the setting power, for determining an ON level of power. In the approximation step, a pulse width error between the first travelling wave power and the third travelling wave power corresponding to the first setting power and a pulse width error between the second travelling wave power and the fourth travelling wave power corresponding to the second setting power are approximated with linear functions. The linear function is a function having setting power and a pulse width error as coordinate axes. The pulse width error is an error between a pulse width based on a duty ratio obtained by using a measured value in the calibration measuring device and a pulse width based on a duty ratio obtained by using a measured value in the wave detector. In the determination step, the correction function is determined on the basis of the linear functions.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 18A to 18D are exemplary diagrams illustrating measurement results of a duty ratio error with respect to setting power, obtained by using a duty ratio after being corrected.

DETAILED DESCRIPTION

Figure 1:
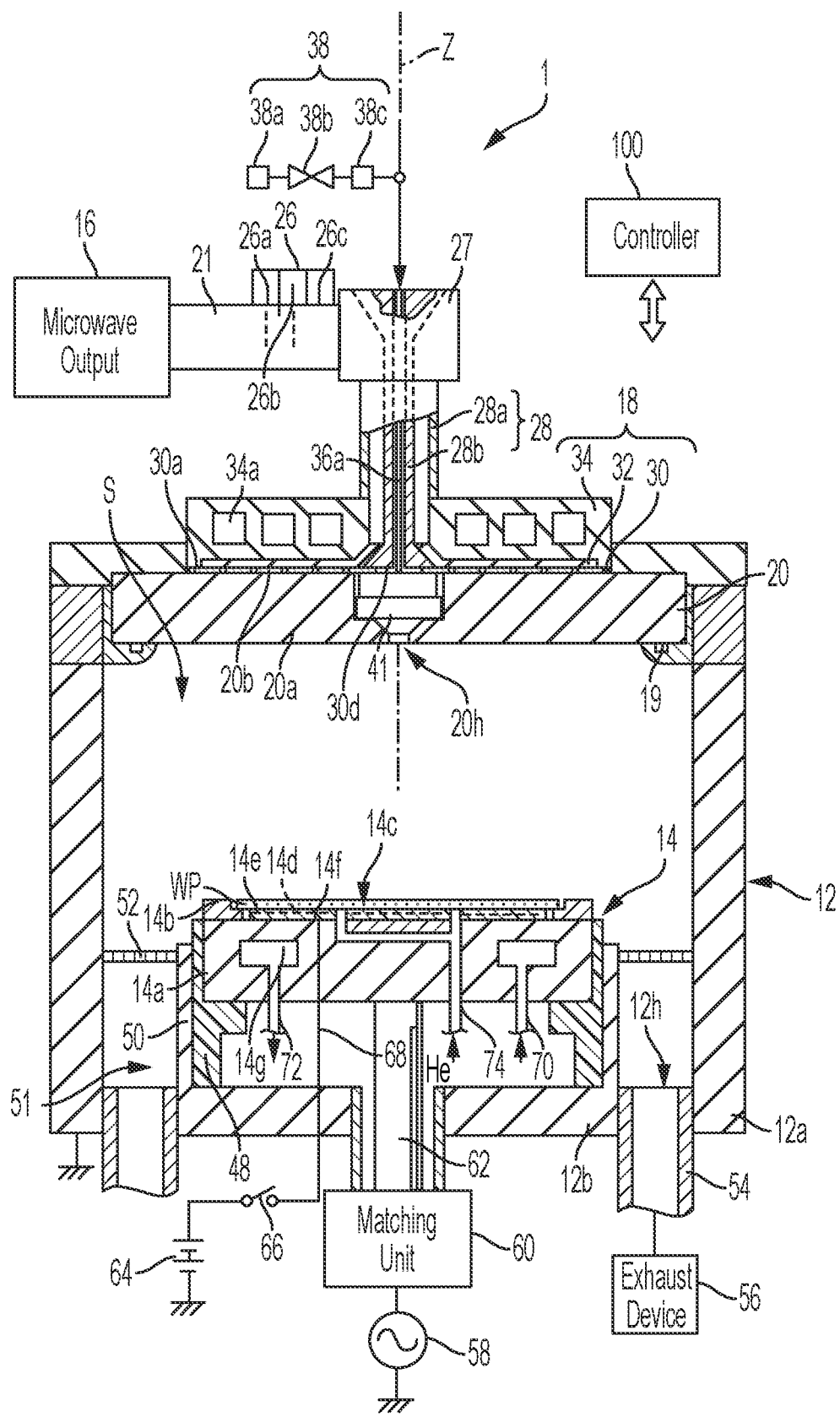
FIG. 1 is a diagram illustrating an example of a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

Hereinafter, various exemplary embodiments will be described.

In an electronic device manufacturing field, achievement of low power of a microwave progresses in order to further reduce damage to an object to be processed. However, if power of a microwave is too low, there is concern that plasma may become unstable or a misfire may occur. In other words, there is a limitation in an approach to achievement of low power. As a separate approach, an electron temperature of plasma may be further reduced.

In order to achieve stabilization of plasma and also to reduce an electron temperature, power of a microwave may be pulse-modulated as in the apparatus disclosed in Japanese Unexamined Patent Publication No. H6-267900 by employing a microwave having a bandwidth as in the apparatus disclosed in Japanese Unexamined Patent Publication No. 2012-109080. In such pulse modulation, it is necessary to accurately check that power of a travelling wave output from the microwave output device is pulse-modulated.

The present disclosure provides an apparatus and a method capable of improving accuracy of monitoring a microwave which has a bandwidth and is pulse-modulated.

In an exemplary embodiment, a microwave monitor device is provided. The microwave monitor device monitors a microwave pulse-modulated such that power thereof is turned on and off. The microwave monitor device includes a wave detector and an acquisition unit. The wave detector is provided on an output side of a microwave generator, and detects a measured value corresponding to travelling wave power of a microwave. The microwave generator generates a microwave having a center frequency and a bandwidth respectively corresponding to a setting frequency and a setting bandwidth. Power of the microwave is pulse-modulated such that a pulse frequency, a duty ratio, and an ON level respectively corresponding to a setting pulse frequency, a setting duty ratio, and ON level setting power are obtained. The acquisition unit acquires the pulse frequency and the duty ratio of the travelling wave power of the microwave on the basis of the measured value detected by the wave detector and a determination threshold value. The determination threshold value is set in advance in a range more than 0% of the setting power and less than 50% thereof, and is used to determine an ON level of power.

In a case where a microwave having a single frequency peak is pulse-modulated such that power thereof is turned on and off, generally, power corresponding to 50% of setting power is employed as a determination threshold value for an ON level. However, in a case where a microwave having a bandwidth is pulse-modulated such that power thereof is turned on and off, power differs for each pulse, and there is also concern that ON level power may vary. Thus, in a case where power corresponding to 50% of setting power is employed as a determination threshold value for an ON level, there is concern that an ON level may not be detected due to a power variation.

According to the microwave monitor device, an ON level of travelling wave power is determined by using a determination threshold value set in advance in a range more than 0% of setting power and less than 50% thereof. Consequently, the microwave monitor device can detect an ON level at lower power than in a case where power of 50% is employed as a determination threshold value for an ON level. Thus, the microwave monitor device can more accurately recognize a time for the ON level. Therefore, the microwave monitor device can improve the accuracy of monitoring a microwave which has a bandwidth and is pulse-modulated such that power thereof is turned on and off.

In an exemplary embodiment, the determination threshold value may be set in advance in a range which is more than 0% of the setting power and is equal to or less than 0.4% thereof. In this case, the microwave monitor device can further improve the accuracy of monitoring a microwave which is pulse-modulated such that power thereof is turned on and off.

In an exemplary embodiment, the microwave monitor device may further include a storage unit and a correction unit. The storage unit stores a correspondence relationship between setting power and a pulse width error in advance. The correction unit corrects the duty ratio acquired by the acquisition unit on the basis of the setting power and the correspondence relationship stored in the storage unit. In a case where a determination threshold value for an ON level is less than 50%, there is concern that an error occurs in a duty ratio. The microwave monitor device can correct a pulse width as a measurement result according to setting power.

In another exemplary embodiment, a method of monitoring a microwave pulse-modulated such that power thereof is turned on and off is provided. The method includes a step of detecting a measured value corresponding to travelling wave power of a microwave of which power is pulse-modulated; and a step of acquiring a frequency and a duty ratio of the travelling wave power of the microwave. The microwave has a center frequency and a bandwidth, and power of the microwave is pulse-modulated such that a pulse frequency, a duty ratio, and an ON level respectively corresponding to a setting pulse frequency, a setting duty ratio, and ON level setting power are obtained. In the acquisition step, the pulse frequency and the duty ratio of the travelling wave power of the microwave are acquired on the basis of a measured value, and a determination threshold value which is set in advance in a range more than 0% of the setting power and less than 50% thereof and is used to determine an ON level of power.

In an exemplary embodiment, the determination threshold value may be set in advance in a range which is more than 0% of the setting power and is equal to or less than 0.4% thereof.

In an exemplary embodiment, the monitoring method may further include a step of correcting the acquired duty ratio on the basis of the setting power and a correspondence relationship between the setting power and a duty ratio correction coefficient.

According to the method of monitoring a pulse-modulated microwave, it is possible to achieve the same effect as in the microwave monitor device.

In still another exemplary embodiment, a method of determining a correction function is provided. The correction function is used to correct a measurement result from a wave detector measuring a microwave which is pulse-modulated such that power thereof is turned on and off. The method includes a first measurement step, a first acquisition step, a second measurement step, a second acquisition step, and an approximation step, and a determination step. In the first measurement step, first travelling wave power and second travelling wave power of a microwave are measured by using a calibration measuring device. The first travelling wave power is power of a microwave having a single frequency peak, and is pulse-modulated such that an ON level corresponds to first setting power. The second travelling wave power is power of a microwave having a single frequency peak, and is pulse-modulated such that an ON level corresponds to second setting power. In the first acquisition step, a duty ratio of the first travelling wave power and a duty ratio of the second travelling wave power are acquired on the basis of measured values in the first measurement step and a first determination threshold value for determining an ON level of power. In the second measurement step, third travelling wave power and fourth travelling wave power of a microwave are measured by using a wave detector. The third travelling wave power is power of a microwave having a center frequency and a bandwidth, and is pulse-modulated such that an ON level corresponds to the first setting power. The fourth travelling wave power is power of a microwave having a center frequency and a bandwidth, and is pulse-modulated such that an ON level corresponds to the second setting power. In the second acquisition step, a duty ratio of the third travelling wave power and a duty ratio of the fourth travelling wave power are acquired on the basis of measured values in the second measurement step and a second determination threshold value, set in advance in a range more than 0% of the setting power and less than 50% of the setting power, for determining an ON level of power. In the approximation step, a pulse width error between the first travelling wave power and the third travelling wave power corresponding to the first setting power and a pulse width error between the second travelling wave power and the fourth travelling wave power corresponding to the second setting power are approximated with linear functions. The linear function is a function having setting power and a pulse width error as coordinate axes. The pulse width error is an error between a pulse width based on a duty ratio obtained by using a measured value in the calibration measuring device and a pulse width based on a duty ratio obtained by using a measured value in the wave detector. In the determination step, the correction function is determined on the basis of the linear functions.

In a case where an ON level of power of a microwave which is pulse-modulated such that power thereof is turned on and off and has a bandwidth is determined by using the second determination threshold value, an error occurs in a pulse width compared with an ON level of power of a microwave which is pulse-modulated in an identical condition and has a single frequency peak. Thus, in this method, a pulse width measured by the wave detector is corrected to be a pulse width measured by the calibration measuring device. As a result of study, findings that a pulse width error depends on setting power have been obtained. In other words, in order to increase correction accuracy, a correction coefficient corresponding to setting power is required to be prepared. However, since setting power differs for each process, all setting power levels are required to be compared with pulse widths measured by the calibration measuring device in order to cope with any process. As a result of study, findings that a pulse width error linearly depends on setting power although there is an individual difference in the wave detector. Therefore, in this method, a pulse width error between the first travelling wave power and the third travelling wave power corresponding to the first setting power and a pulse width error between the second travelling wave power and the fourth travelling wave power corresponding to the second setting power are approximated with linear functions. The correction function is determined on the basis of the linear functions. Consequently, according to the method, at least two pieces of data are used, and thus it is possible to determine a correction function for correcting a pulse width error with respect to any setting power.

In an exemplary embodiment, the first setting power and the second setting power may be equal to or more than 1000 W. In this case, the accuracy of approximation using a linear function is improved.

Hereinafter, various embodiments will be described in detail with reference to the drawings. In the following description and drawings, the same reference numeral will be given to the same portion or an equivalent portion, and overlapping description will not be repeated. A dimension ratio in the drawing does not necessarily match a described dimension ratio. The terms "upper", "lower", "left", and "right" are based on illustrated states and are terms for convenience.

First Embodiment

Plasma Processing Apparatus

FIG. 1 is a diagram illustrating a plasma processing apparatus according to an embodiment. As illustrated in FIG. 1, a plasma processing apparatus 1 includes a chamber main body 12 and a microwave output device 16. The plasma processing apparatus 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axis of the side wall 12a approximately matches an axis Z which extends in a vertical direction. The bottom portion 12b is provided on a lower end side of the side wall 12a. An exhaust hole 12h for exhaust is provided in the bottom portion 12b. An upper end of the side wall 12a is an opening.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber main body 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an embodiment, the stage 14 includes a base 14a and an electrostatic chuck 14c. The base 14a has an approximately disc shape, and is formed from a conductive material such as aluminum. A central axis of the base 14a approximately matches the axis Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber main body 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.56 MHz with power which is set.

The radio frequency power supply 58 may have a pulse generator, and may pulse-modulate radio frequency power (RF power) which is then applied to the base 14a. In this case, the radio frequency power supply 58 pulse-modulates the radio frequency power such that high level power and low level power are periodically repeated. The radio frequency power supply 58 performs pulse adjustment on the basis of a synchronization signal PSS-R generated by the pulse generator. The synchronization signal PSS-R is a signal for determining a cycle and a duty ratio of the radio frequency power. As an example of setting during pulse modulation, a pulse frequency is 10 Hz to 250 kHz, and a duty ratio of a pulse (a ratio of a high level power time to a pulse cycle) is 10% to 90%.

The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device. In a case where radio frequency power is pulse-modulated, the matching unit 60 is operated to perform matching on the basis of the synchronization signal PSS-R.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axis of the electrostatic chuck 14c approximately matches the axis Z. The electrode 14d of the electrostatic chuck 14c is configured with a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axis Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas which is supplied into the chamber main body 12. The microwave output device 16 is configured to variably adjust a frequency, power, and a bandwidth of the microwave. The microwave output device 16 may generate a microwave having a single frequency by setting, for example, a bandwidth of the microwave to substantially 0. The microwave output device 16 may generate a microwave having a bandwidth having a plurality of frequency components. Power levels of the plurality of frequency components may be the same as each other, and only a center frequency component in a band may have a power level higher than power levels of other frequency components. In an example, the microwave output device 16 may adjust the power of the microwave in a range of 0 W to 5000 W. The microwave output device 16 may adjust the frequency or the center frequency of the microwave in a range of 2400 MHz to 2500 MHz. The microwave output device 16 may adjust the bandwidth of the microwave in a range of 0 MHz to 400 MHz. The microwave output device 16 may adjust a frequency pitch (carrier pitch) of the plurality of frequency components of the microwave in the bandwidth in a range of 0 to 25 kHz.

The microwave output device 16 may include a pulse generator, and may pulse-modulate and output power of a microwave. In this case, the microwave output device 16 pulse-modulates the microwave such that high level power and low level power are periodically repeated. The microwave output device 16 adjusts a pulse on the basis of a synchronization signal PSS-M generated by the pulse generator. The synchronization signal PSS-M is a signal for determining a cycle and a duty ratio of microwave power. As an example of setting during pulse modulation, a pulse frequency is 1 Hz to 50 kHz, and a duty ratio of a pulse (a ratio of a high level power time to a pulse cycle) is 10% to 90%. The microwave output device 16 may pulse-modulate microwave power to be synchronized with radio frequency power pulse-modulated, output from the radio frequency power supply 58.

The plasma processing apparatus 1 further includes a wave guide tube 21, a tuner 26, a mode converter 27, and a coaxial wave guide tube 28. An output unit of the microwave output device 16 is connected to one end of the wave guide tube 21. The other end of the wave guide tube 21 is connected to the mode converter 27. For example, the wave guide tube 21 is a rectangular wave guide tube. The tuner 26 is provided in the wave guide tube 21. The tuner 26 has stubs 26a, 26b, and 26c. Each of the stubs 26a, 26b, and 26c is configured to adjust a protrusion amount thereof with respect to an inner space of the wave guide tube 21. The tuner 26 adjusts a protrusion position of each of the stubs 26a, 26b, and 26c with respect to a reference position so as to match impedance of the microwave output device 16 with impedance of a load, for example, impedance of the chamber main body 12.

The mode converter 27 converts a mode of the microwave transmitted from the wave guide tube 21, and supplies the microwave having undergone mode conversion to the coaxial wave guide tube 28. The coaxial wave guide tube 28 includes an outer conductor 28a and an inner conductor 28b. The outer conductor 28a has an approximately cylindrical shape, and a central axis thereof approximately matches the axis Z. The inner conductor 28b has an approximately cylindrical shape, and extends on an inner side of the outer conductor 28a. A central axis of the inner conductor 28b approximately matches the axis Z. The coaxial wave guide tube 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axis of the slot plate 30 approximately matches the axis Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axis Z. In addition, a through-hole 30d through which a conduit 36 to be described later can pass is formed in the central portion of the slot plate 30.

The dielectric plate 32 is formed on the slot plate 30. The dielectric plate 32 is formed from a dielectric material such as quartz, and has an approximately disc shape. A central axis of the dielectric plate 32 approximately matches the axis Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. A lower end of the inner conductor 28b passes through a hole formed in a central portion of the cooling jacket 34 and the dielectric plate 32 and is electrically connected to the slot plate 30.

A microwave from the coaxial wave guide tube 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial wave guide tube 28. As described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. The process gas is excited by a microwave which is introduced into the processing space S from the dielectric window 20. According to this, plasma is generated in the processing space S, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes a keyboard or a touch panel with which a process manager performs a command input operation and the like so as to manage the plasma processing apparatus 1, a display which visually displays an operation situation of the plasma processing apparatus 1 and the like.

The storage unit stores control programs (software) for realizing various kinds of processing executed by the plasma processing apparatus 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing apparatus 1 under the control of the processor.

Configuration Example of Microwave Output Device 16

Figure 2:
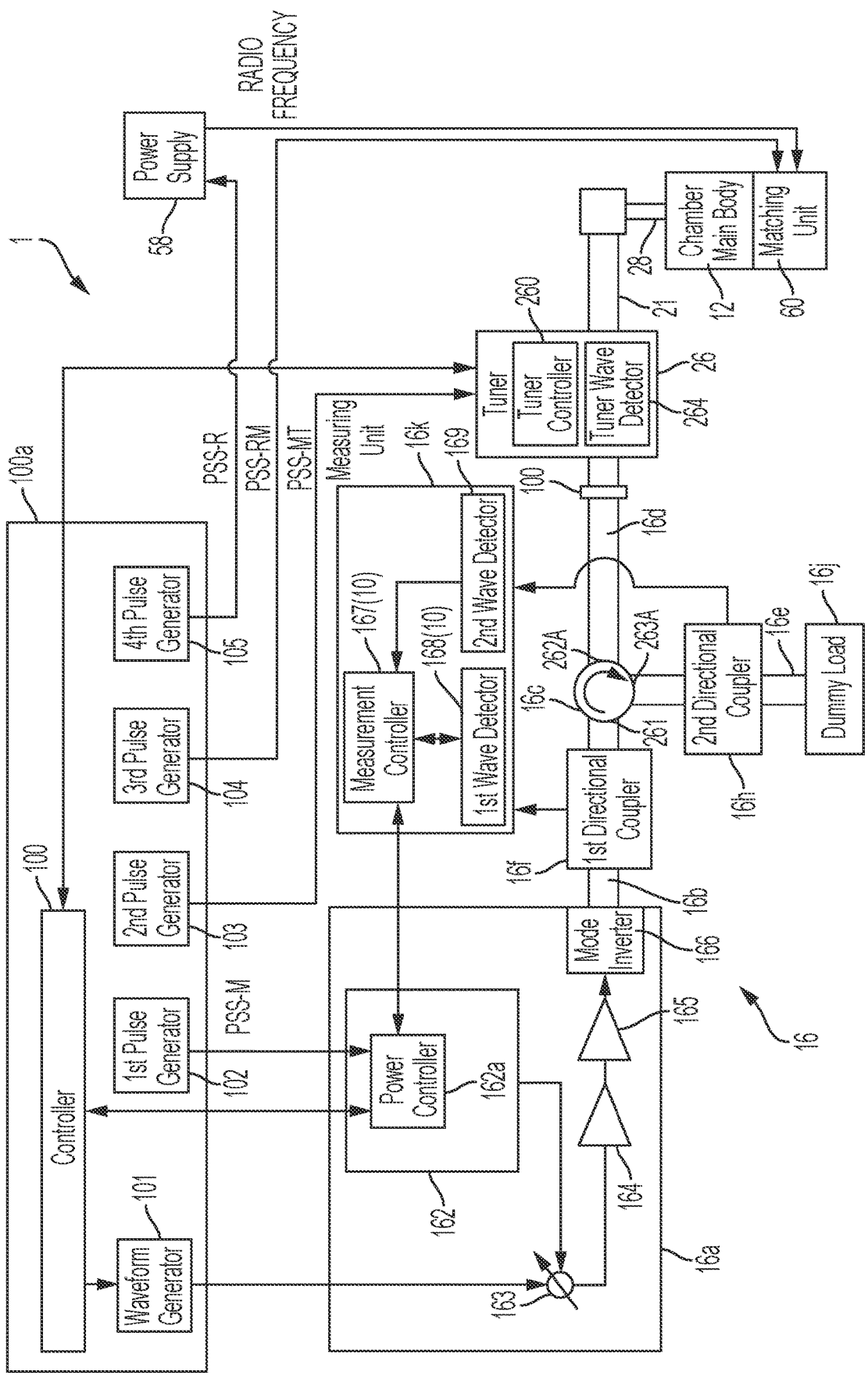
FIG. 2 is a diagram illustrating an example of a microwave output device.

FIG. 2 is a diagram illustrating an example of the microwave output device. As illustrated in FIG. 2, the microwave output device 16 is connected to a calculation device 100a. The calculation device 100a includes a controller 100, a waveform generator 101, a first pulse generator 102, a second pulse generator 103, a third pulse generator 104, and a fourth pulse generator 105.

The waveform generator 101 generates a waveform of a microwave. The waveform generator 101 generates a waveform of a microwave having a center frequency and a bandwidth respectively corresponding to a setting frequency and a setting bandwidth designated by the controller 100. The waveform generator 101 outputs the waveform of the microwave to the microwave output device 16.

The first pulse generator 102 generates a synchronization signal used to pulse-modulate microwave power in the microwave output device 16. The first pulse generator 102 generates the synchronization signal PSS-M on the basis of a setting pulse frequency and a setting duty ratio of microwave power in a setting profile which is set by the controller 100. The first pulse generator 102 outputs the synchronization signal PSS-M to the microwave output device 16.

The second pulse generator 103 generates a synchronization signal which is used to subject microwave power of which power is pulse-modulated to impedance matching in the tuner 26. In the same manner as the first pulse generator 102, the second pulse generator 103 generates a synchronization signal PSS-MT on the basis of a setting pulse frequency and a setting duty ratio of microwave power in a setting profile which is set by the controller 100. The synchronization signal PSS-MT has the same pulse frequency and duty ratio as those of the synchronization signal PSS-M. The second pulse generator 103 outputs the synchronization signal PSS-MT to the tuner 26.

The third pulse generator 104 generates a synchronization signal which is used to pulse-modulate radio frequency power in the radio frequency power supply 58. The third pulse generator 104 generates a synchronization signal PSS-R on the basis of a setting pulse frequency and a setting duty ratio of radio frequency power in a setting profile which is set by the controller 100. The third pulse generator 104 outputs the synchronization signal PSS-R to the radio frequency power supply 58.

The fourth pulse generator 105 generates a synchronization signal which is used to subject a radio frequency of which power is pulse-modulated to impedance matching in the matching unit 60. In the same manner as the third pulse generator 104, the fourth pulse generator 105 generates a synchronization signal PSS-RM on the basis of a setting pulse frequency and a setting duty ratio of radio frequency power in a setting profile which is set by the controller 100. The synchronization signal PSS-RM has the same pulse frequency and duty ratio as those of the synchronization signal PSS-R. The fourth pulse generator 105 outputs the synchronization signal PSS-RM to the matching unit 60.

The first pulse generator 102 may generate the synchronization signal PSS-M which is synchronized with the synchronization signal PSS-R. In this case, pulse-modulation of microwave power and pulse-modulation of radio frequency power can be synchronized with each other, and thus it is possible to stably generate plasma.

The microwave output device 16 pulse-modulates the waveform of the microwave generated by the waveform generator 101 according to the setting in the controller 100, and outputs the microwave. The microwave output device 16 includes a microwave generator 16a, a wave guide tube 16b, a circulator 16c, a wave guide tube 16d, a wave guide tube 16e, a first directional coupler 16f, a second directional coupler 16h, a measurement unit 16k (an example of a measurement unit), and a dummy load 16j.

The microwave generator 16a generates a microwave of which power is pulse-modulated. The microwave generator 16a acquires a setting pulse frequency, a setting duty ratio, high level setting power, and low level setting power for which instructions are given by the controller 100. The microwave generator 16a generates the microwave of which power is pulse-modulated so as to obtain a pulse frequency, a duty ratio, high level power, and low level power respectively corresponding to the settings for which instructions are given by the controller 100. In a case where the low level setting power is 0 W, the power is pulse-modulated to be turned on and off. Hereinafter, a description will be made of an example in which the power is pulse-modulated to be turned on and off.

The microwave generator 16a includes a power controller 162, an attenuator 163, an amplifier 164, an amplifier 165, and a mode converter 166.

The waveform generator 101 is connected to the attenuator 163. The attenuator 163 is a device which can change an attenuation amount (attenuation rate) according to an applied voltage value as an example. The attenuator 163 is connected to the power controller 162. The power controller 162 controls an attenuation rate (attenuation amount) of a microwave in the attenuator 163 by using an applied voltage value. The attenuation rate (attenuation amount) of a microwave is controlled such that a microwave output from the waveform generator 101 becomes a microwave having power corresponding to a setting pulse frequency, a setting duty ratio, and ON level setting power for which instructions are given by the controller 100.

The power controller 162 includes the control unit 162a as an example. The control unit 162a may be a processor. The control unit 162a acquires a setting profile from the controller 100. The control unit 162a acquires the synchronization signal PSS-M from the first pulse generator 102. The control unit 162a determines an attenuation rate (attenuation amount) of a microwave on the basis of the synchronization signal PSS-M, and the setting profile which is set by the controller 100.

An output of the attenuator 163 is connected to the mode converter 166 via the amplifier 164 and the amplifier 165. Each of the amplifier 164 and the amplifier 165 amplifies a microwave at a predetermined amplification rate. The mode converter 166 converts a propagation mode of a microwave output from the amplifier 165 from TEM into TE01. A microwave, which is generated through the mode conversion in the mode converter 166, is output as an output microwave of the microwave generator 16a.

An output of the microwave generator 16a is connected to one end of the wave guide tube 16b. The other end of the wave guide tube 16b is connected to a first port 261 of the circulator 16c. The circulator 16c includes a first port 261, a second port 262A, and a third port 263A. The circulator 16c outputs a microwave, which is input to the first port 261, from the second port 262A, and outputs a microwave, which is input to the second port 262A, from the third port 263A. One end of the wave guide tube 16d is connected to the second port 262A of the circulator 16c. The other end of the wave guide tube 16d is an output unit 16t of the microwave output device 16.

One end of the wave guide tube 16e is connected to the third port 263A of the circulator 16c. The other end of the wave guide tube 16e is connected to the dummy load 16j. The dummy load 16j receives a microwave which propagates through the wave guide tube 16e and absorbs the microwave. For example, the dummy load 16j converts the microwave into heat.

The first directional coupler 16f is provided between one end and the other end of the wave guide tube 16b. The first directional coupler 16f is configured to branch parts of microwaves (that is, travelling waves) which are output from the microwave generator 16a and propagate to the output unit 16t, and to output the parts of the travelling waves.

The second directional coupler 16h is provided between one end and the other end of the wave guide tube 16e. The second directional coupler 16h is configured to branch parts of reflected waves transmitted to the third port 263A of the circulator 16c with respect to microwaves (that is, reflected waves) which return to the output unit 16t, and to output the parts of the reflected waves.

The measurement unit 16k is a device which measures a microwave in the wave guide tube. The measurement unit 16k includes a measurement controller 167 (an example of an acquisition unit), a first wave detector 168 (an example of a wave detector), and a second wave detector 169.

The first wave detector 168 detects a measured value corresponding to travelling wave power of a microwave in the wave guide tube. The first wave detector 168 is provided on an output side of the microwave generator 16a, and receives a travelling wave output from the first directional coupler 16f. Details of the first wave detector 168 of the measurement unit 16k will be described later. The second wave detector 169 detects a measured value corresponding to reflected wave power of a microwave in the wave guide tube. The second wave detector 169 receives a reflected wave output from the second directional coupler 16h.

The measurement controller 167 acquires a frequency and a duty ratio of travelling wave power on the basis of a measured value detected by the first wave detector 168. A method in which the measurement controller 167 acquires a frequency and a duty ratio of travelling wave power will be described later.

The measurement unit 16k is connected to the power controller 162. The measurement unit 16k outputs the measured values to the power controller 162. The power controller 162 controls the attenuator 163 such that a difference between the measured values of a travelling wave and a reflected wave, that is, load power (effective power) matches setting power designated by the controller 100 (power feedback control).

A microwave monitor device 10 according to the present embodiment is configured to include the measurement controller 167 and the first wave detector 168. In other words, the microwave monitor device 10 branches a signal from a directional coupler used for the power feedback control, and monitors the signal. The microwave monitor device 10 is not necessarily integrated with a configuration for the power feedback control, and may be provided separately from the configuration for the power feedback control.

The tuner 26 includes a tuner controller 260 and a tuner wave detector 264. The tuner controller 260 adjusts protrusion positions of the stubs 26a, 26b, and 26c such that impedance on the microwave output device 16 side matches impedance on the antenna 18 side on the basis of a signal from the controller 100 and a detection result from the tuner wave detector 264. The tuner wave detector 264 is a three-probe wave detector as an example, and has three probes with diodes. The tuner controller 260 causes a driver circuit and an actuator (not illustrated) to operate the stubs 26a, 26b, and 26c.

The tuner controller 260 acquires the synchronization signal PSS-MT for microwave power generated by the second pulse generator 103. The tuner controller 260 operates the stubs 26a, 26b, and 26c on the basis of the synchronization signal. The radio frequency power supply 58 acquires the synchronization signal PSS-R for radio frequency power generated by the third pulse generator 104. The radio frequency power supply 58 pulse-modulates radio frequency power on the basis of the synchronization signal PSS-R. The matching unit 60 acquires the synchronization signal PSS-MT for radio frequency power generated by the fourth pulse generator 105. The matching unit 60 performs matching on pulse-modulated radio frequency power on the basis of the synchronization signal PSS-MT.

Details of Waveform Generator

Figure 3:
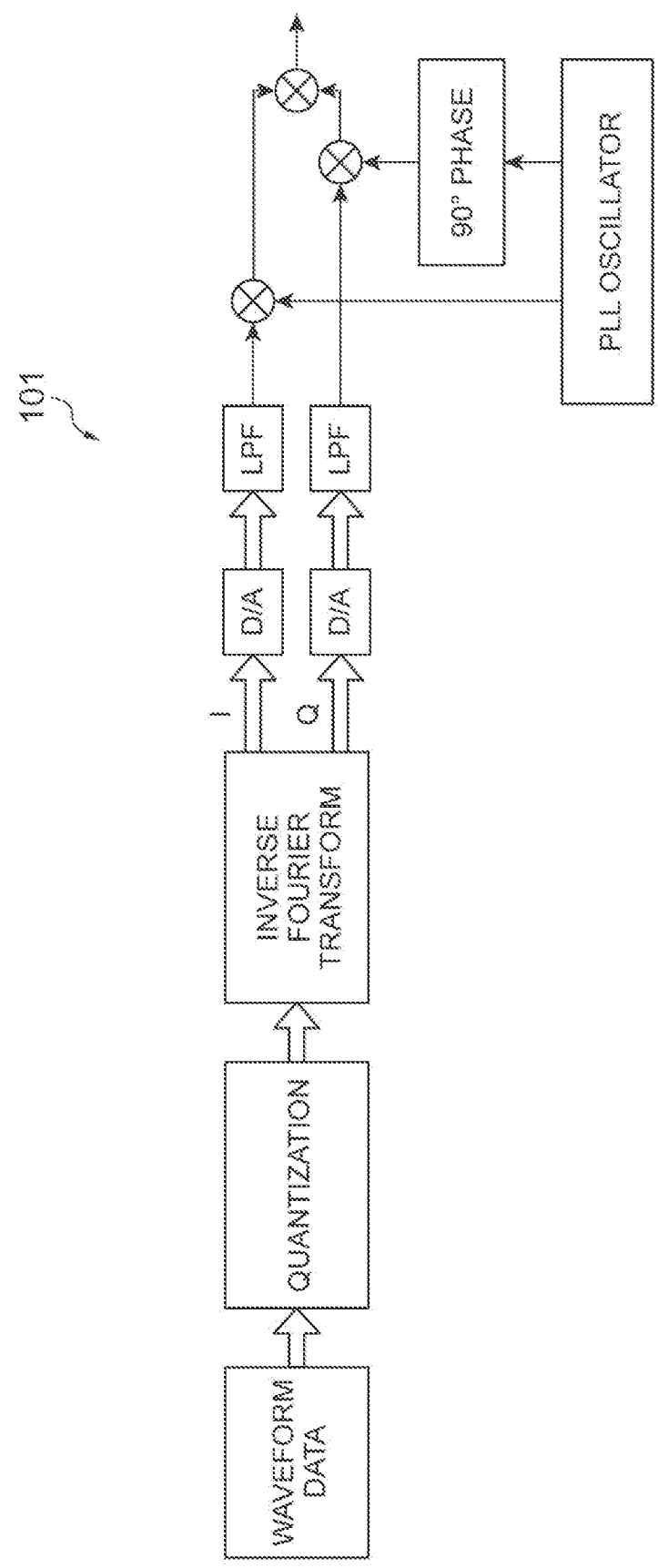
FIG. 3 is a diagram illustrating an example of a microwave generation principle in a waveform generator.

FIG. 3 is a view illustrating a microwave generation principle in the waveform generator. As illustrated in FIG. 3, for example, the waveform generator 101 includes a phase locked loop (PLL) oscillator which can cause a microwave of which a phase is synchronized with that of a reference frequency to oscillate, and an IQ digital modulator which is connected to the PLL oscillator. The waveform generator 101 sets a frequency of a microwave which oscillates in the PLL oscillator to a setting frequency designated by the controller 100. The waveform generator 101 modulates a microwave from the PLL oscillator, and a microwave having a phase difference with the microwave from the PLL oscillator by 90° by using the IQ digital modulator. Consequently, the waveform generator 101 generates a microwave having a plurality of frequency components in a bandwidth or a microwave having a single frequency.

The waveform generator 101 may perform inverse discrete Fourier transform on, for example, N complex data symbols so as to generate a continuous signal and thus to generate a microwave having a plurality of frequency components. A method of generating such a signal may be a method such as an orthogonal frequency-division multiple access (OFDMA) modulation method used for digital TV broadcasting.

In an example, the waveform generator 101 has waveform data expressed by a digitalized code sequence in advance. The waveform generator 101 quantizes the waveform data, and applies the inverse Fourier transform to the quantized data so as to generate I data and Q data. The waveform generator 101 applies digital/analog (D/A) conversion to each of the I data and the Q data so as to obtain two analog signals. The waveform generator 101 inputs the analog signals to a low-pass filter (LPF) through which only a low frequency component passes. The waveform generator 101 mixes the two analog signals, which are output from the LPF, with a microwave from the PLL oscillator and a microwave having a phase difference with the microwave from the PLL oscillator by 90°, respectively. The waveform generator 101 combines microwaves which are generated through the mixing with each other. Consequently, the waveform generator 101 generates a microwave having a single frequency component or a plurality of frequency components.

Details of First Wave Detector and Measurement Controller of Measurement Unit

Figure 4:
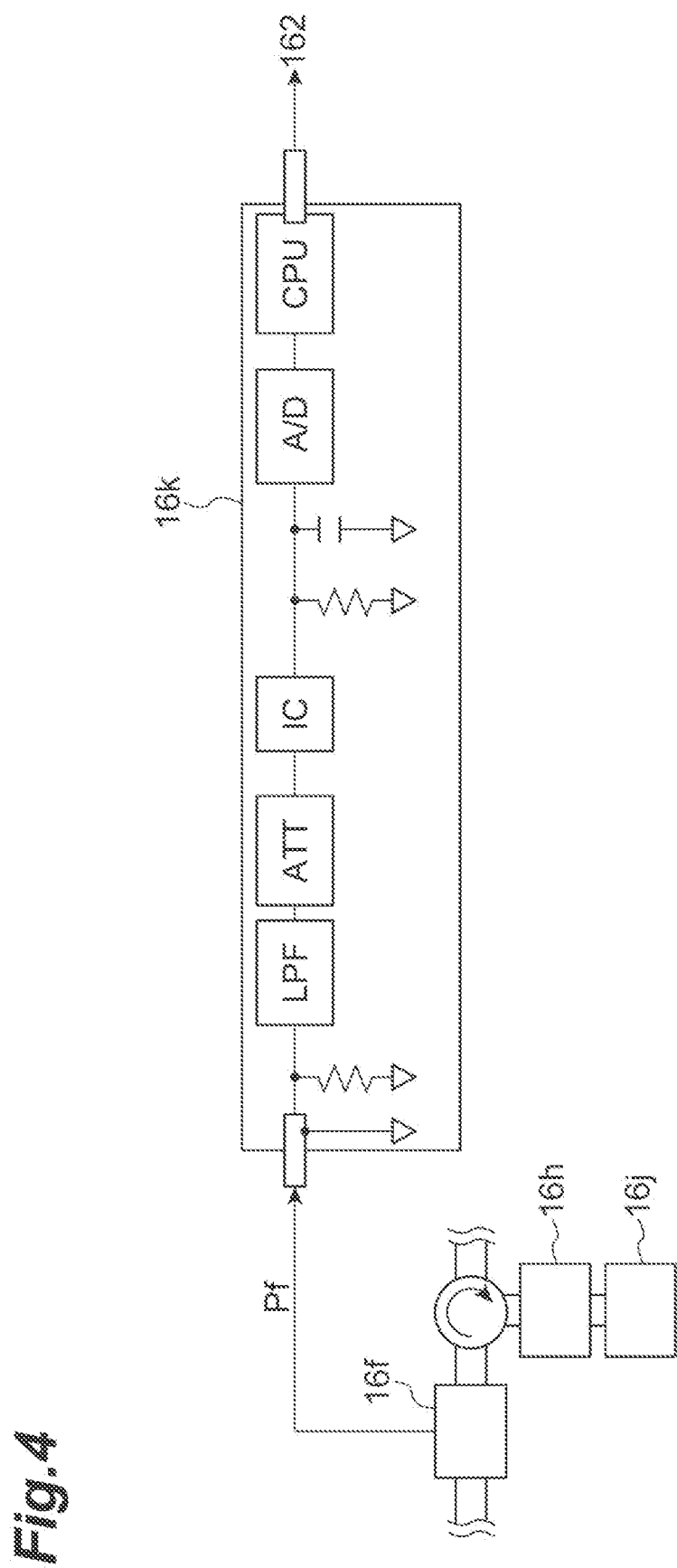
FIG. 4 is a diagram illustrating examples of a first wave detector and a measurement controller of a measurement unit.

FIG. 4 is a diagram illustrating examples of the first wave detector 168 and the measurement controller 167 of the measurement unit 16k. FIG. 4 illustrates only a portion detecting travelling wave power in the measurement unit 16k. The measurement unit 16k receives travelling wave power Pf of a microwave via a port. The measurement unit 16k removes an unnecessary frequency component of the travelling wave power Pf by using a low-pass filter LPF. Next, the measurement unit 16k attenuates the travelling wave power Pf to a signal level appropriately for a subsequent circuit IC by using an attenuator ATT. Next, the measurement unit 16k converts the travelling wave power Pf into an analog voltage corresponding to the power by using the circuit IC. Next, the measurement unit 16k removes a noise component by averaging the travelling wave power Pf by using a circuit. Sampling of averaging using the circuit is performed at 0.1 µs or less herein. The measurement unit 16k removes the noise component, and then converts the travelling wave power Pf into a digital signal by using an A/D converter. The processes hitherto correspond to functions of the first wave detector 168. Next, the measurement unit 16k converts the digital signal into power by using a CPU, and outputs the power from a port. An example of an output destination is the power controller 162. The process of the CPU corresponds to a function of the measurement controller 167. As mentioned above, the measurement unit 16k can detect travelling wave power, and output the travelling wave power to the power controller 162.

Example of Microwave

Figure 5:
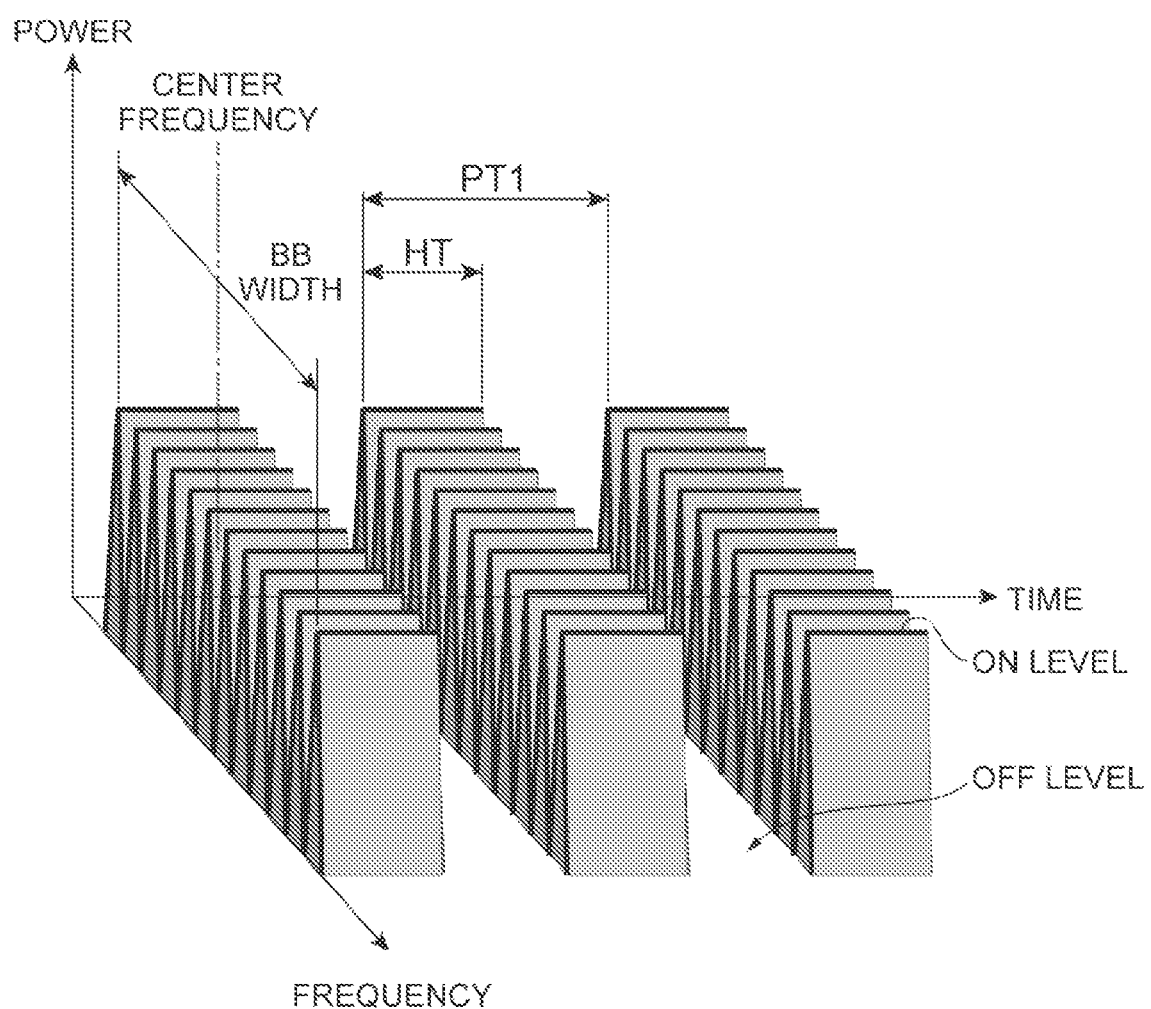
FIG. 5 is a diagram illustrating an example of a microwave of which power is pulse-modulated.

Power of a microwave output from the microwave generator 16a has a waveform modulated in a pulsed shape such that ON level power and OFF level power (0 W) are repeated. FIG. 5 illustrates an example of a microwave of which power is pulse-modulated to be turned on and off. As illustrated in FIG. 5, the microwave has a center frequency and a bandwidth (BB width) respectively corresponding to a setting frequency and a setting bandwidth for which instructions are given by the controller 100. The microwave has a pulse frequency PT1, a duty ratio HT, and ON level power respectively corresponding to a setting pulse frequency, a setting duty ratio, and ON level setting power for which instructions are given by the controller 100. In a case of a microwave having a single frequency peak, a plurality of waveforms having an ON level in an identical time period illustrated in FIG. 5 become a single waveform centering on the center frequency, and the single waveform repeats ON and OFF.

Signal Waveform Related to ON/OFF of Power

Figure 6A:
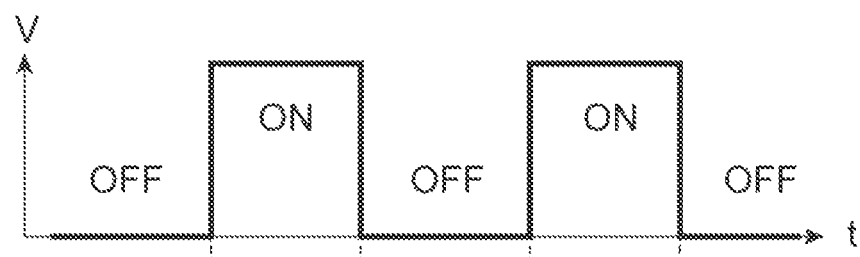
FIGS. 6A to 6D correspond to diagrams illustrating examples of signal waveforms related to ON/OFF control.
Figure 6B:
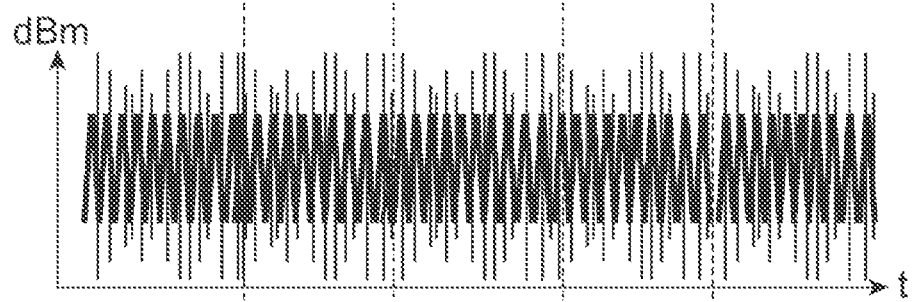
Figure 6C:
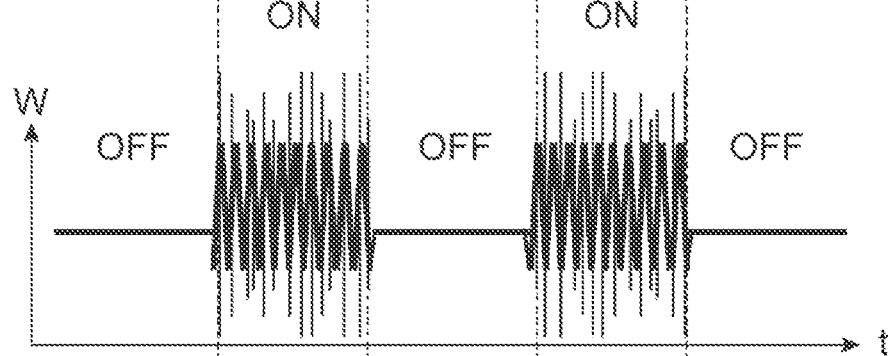
Figure 6D:
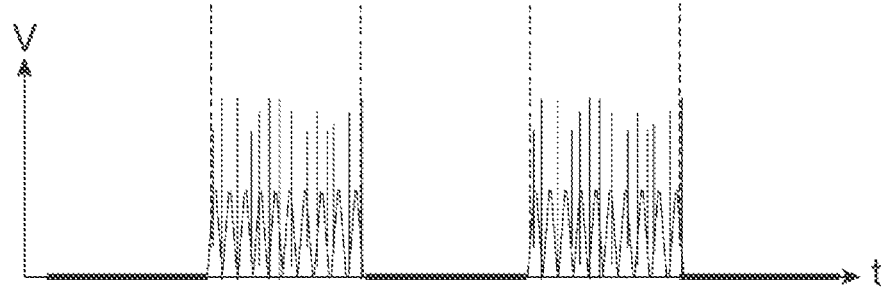

FIGS. 6A to 6D illustrate examples of signal waveforms related to ON/OFF control. A plurality of waveforms illustrated in FIGS. 6A to 6D match each other in timings on a time axis. FIG. 6A illustrates a signal having a waveform of the synchronization signal PSS-M generated by the first pulse generator 102. FIG. 6B illustrates a signal having a waveform of a microwave generated by the microwave generator 101. FIG. 6C illustrates a waveform of a microwave modulated on the basis of the signal in FIG. 6A and the signal in FIG. 6B. FIG. 6D illustrates a signal having a waveform obtained by detecting the signal in FIG. 6C. A transverse axis in each drawing expresses time. The signal in FIG. 6B is attenuated on the basis of the signal in FIG. 6A by the power controller 162 and the attenuator 163. For example, the signal in FIG. 6B is attenuated to 0 W in an OFF time of the synchronization signal PSS-M. The attenuated signal is amplified by the amplifier 164 and the amplifier 165 to become the signal in FIG. 6C. The signal in FIG. 6C is amplified such that power in an ON state is setting power Pset. The ON state of the signal in FIG. 6C matches an ON time of the synchronization signal PSS-M appearing in the signal in FIG. 6A. In a case where the signal in FIG. 6C is detected by the first wave detector 168, the waveform of the signal in FIG. 6D is obtained. The measurement controller 167 determines a duty ratio and a pulse cycle (pulse frequency) of travelling wave power by using the signal in FIG. 6D.

Waveform of Microwave Having Single Frequency Peak

Figure 7:
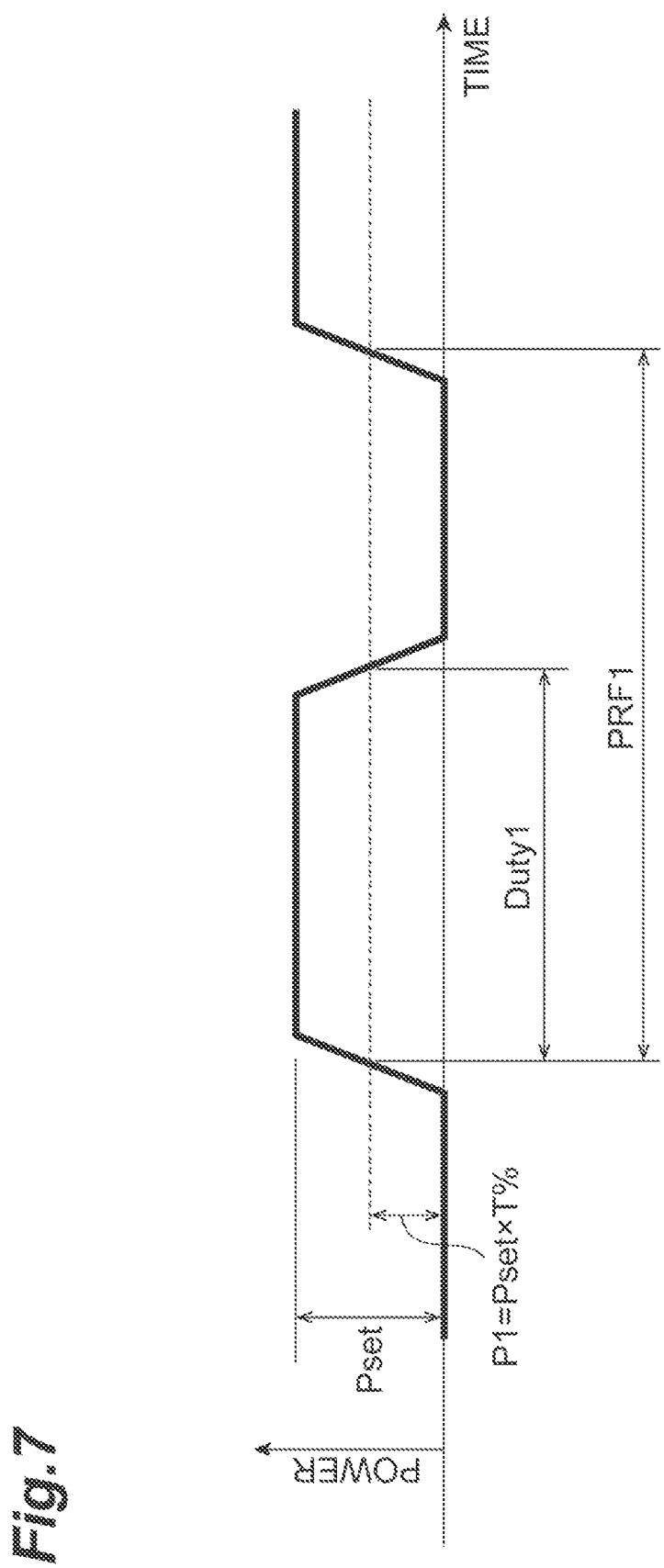
FIG. 7 is a diagram illustrating examples of a pulse frequency and a duty ratio of a microwave having a single frequency peak.

FIG. 7 illustrates examples of a pulse frequency and a duty ratio of a microwave having a single frequency peak. As illustrated in FIG. 7, in a case of the microwave having the single frequency peak, the microwave has a pulsed waveform turned on and off in which noise is reduced in the same manner as the synchronization signal PSS-M. ON level power is the setting power Pset. The waveform includes a switching location between ON and OFF, that is, a waveform rising portion and a waveform falling portion. Thus, a duty ratio is determined by using a determination threshold value P1 (an example of a first determination threshold value). The determination threshold value P1 is obtained by multiplying the setting power by a ratio T % herein. As an example, in a case where the ratio T is 50%, the determination threshold value P1 is the setting power Pset×0.5. An ON level is from the time at which power is equal to or more than the determination threshold value P1 to the time at which the power is equal to or less than the determination threshold value P1. An OFF level is reverse thereto, and a section formed of a single ON level and a single OFF level corresponds to a pulse frequency PRF1. A section of an ON level in a single pulse frequency PRF1 is a duty ratio Duty1. As mentioned above, the measurement controller 167 monitors a pulse by using the determination threshold value P1.

Waveform of Microwave Having Bandwidth

In a case of a waveform of a microwave having a bandwidth, a duty ratio and a pulse frequency can also be monitored by using a determination threshold value in the same manner as in a microwave having a single frequency peak. However, in a case where the setting power Pset×0.5 is used as a determination threshold value, the accuracy of monitoring a pulse deteriorates. The reason why the accuracy deteriorates is that, in a case of a waveform of a microwave having a bandwidth, measured power differs for each pulse, and thus ON level power of the pulse is not stable (changes). Thus, a determination threshold value for determining ON level power of a microwave having a bandwidth is set in advance in a range which is more than 0% of the setting power Pset and is less than 50% thereof. For example, in a case where the setting power Pset can take a range of 0 to 2700 W, a determination threshold value is a value more than 0 W and less than 1350 W. The determination threshold value may be set in advance in a range which is more than 0% of the setting power Pset and is equal to or less than 0.4% thereof. In this case, the determination threshold value is a value more than 0 W and equal to or less than 11 W. As a determination threshold value is closer to 0, an ON level is determined at lower power, and thus an ON time can be accurately determined.

Figure 8:
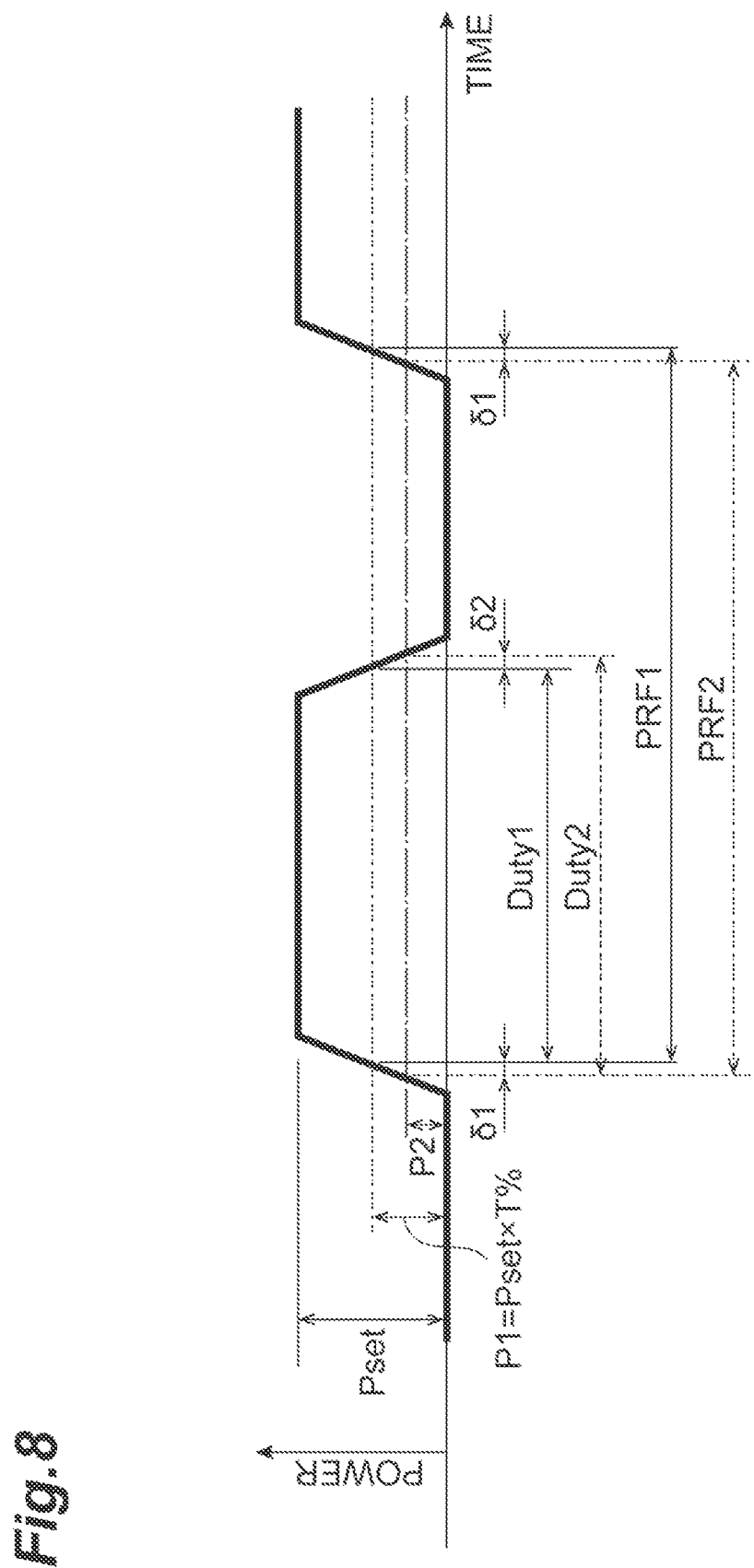
FIG. 8 is a diagram illustrating an example of comparison of a pulse frequency and a duty ratio of a microwave having a single frequency peak with a pulse frequency and a duty ratio of a microwave having a bandwidth.

FIG. 8 illustrates an example of comparison of a pulse frequency and a duty ratio of a microwave having a single frequency peak with a pulse frequency and a duty ratio of a microwave having a bandwidth. In the same manner as in FIG. 7, FIG. 8 illustrates the determination threshold value P1, the duty ratio Duty1, and the pulse frequency PRF1 for a single frequency peak. A determination threshold value for determining ON level power of a microwave having a bandwidth is a determination threshold value P2 (an example of a second determination threshold value). The determination threshold value P2 is set in a range which is more than 0% of the setting power Pset and is less than 50% thereof, and is set in advance, for example, in a range which is more than 0% of the setting power Pset and is equal to or less than 0.4% thereof. The measurement controller 167 acquires a duty ratio Duty2 and a pulse frequency PRF2 by using the determination threshold value P2. The duty ratio Duty2 is increased by δ1+δ2 compared with the duty ratio Duty1. On the other hand, the pulse frequency PRF2 is deviated by δ1 in terms of timing, but matches the pulse frequency PRF1. Thus, the measurement controller 167 can acquire at least an accurate pulse frequency by using the determination threshold value P2.

Operation of Microwave Monitor Device

Figure 9:
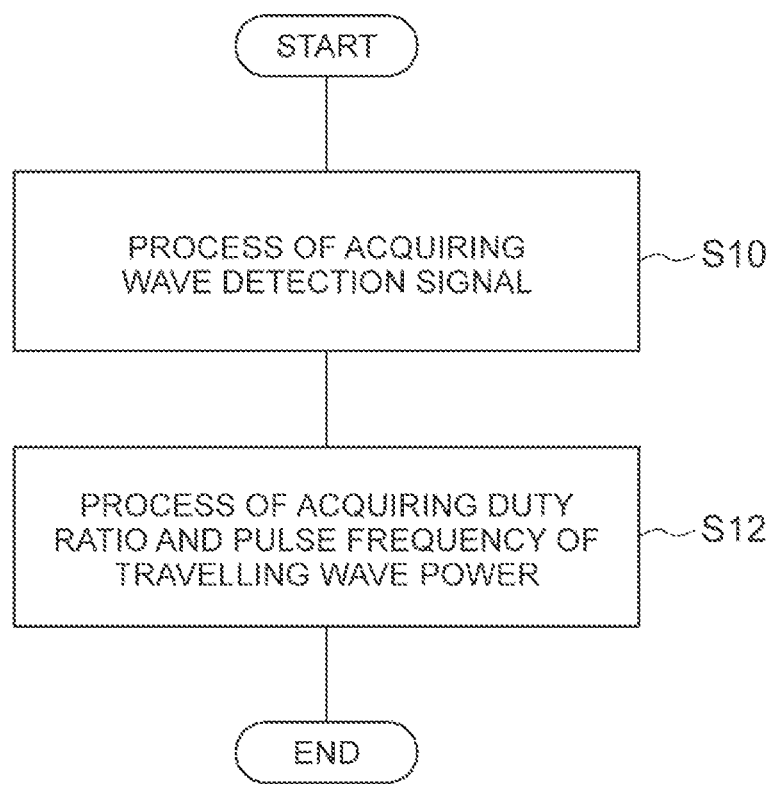
FIG. 9 is a flowchart illustrating an example of an operation of a microwave monitor device.

FIG. 9 is a flowchart illustrating an example of an operation of the microwave monitor device. The flowchart of FIG. 9 is started, for example, when an instruction for turning on a pulse monitor function is input through a worker's operation. As illustrated in FIG. 9, first, the first wave detector 168 of the microwave output device 16 acquires a wave detection signal for the travelling wave power Pf as a wave detection signal acquisition process (step S10) (refer to the signal in FIG. 6D). Next, the measurement controller 167 of the microwave output device 16 acquires a duty ratio and a pulse frequency of the travelling wave power Pf by using the determination threshold value P2 as a pulse information acquisition process (step S12). The determination threshold value P2 is set in advance in a range which is more than 0% of the setting power Pset and is less than 50% thereof. When the pulse information acquisition process (step S12) is finished, the process illustrated in FIG. 9 is finished. After the flowchart of FIG. 9 is finished, the process illustrated in FIG. 9 may be executed from the beginning again until a finishing condition is satisfied. An example of the finishing condition is the time at which, for example, an instruction for turning off the pulse monitor function is input through a worker's operation.

Summary of First Embodiment

According to the microwave monitor device 10 of the first embodiment, an ON level of the travelling wave power Pf is determined by using the determination threshold value P2 which is set in advance in a range more than 0% of the setting power Pset and less than 50% thereof. Alternatively, the determination threshold value P2 is set in a range more than 0% of the setting power and equal to or less than 0.4% thereof. Consequently, the microwave monitor device 10 can detect an ON level at lower power than in a case where power of 50% is employed as a determination threshold value for an ON level. Thus, the microwave monitor device 10 can more accurately recognize a time for the ON level. Therefore, the microwave monitor device 10 can improve the accuracy of monitoring a microwave which has a bandwidth and is pulse-modulated such that power thereof is turned on and off.

Second Embodiment

A microwave monitor device 10A according to a second embodiment is the same as the microwave monitor device 10 according to the first embodiment except that a correction unit 170 and a storage unit 171 are provided. Hereinafter, a difference between the microwave monitor device 10A and the microwave monitor device 10 will be focused, and overlapping description will not be repeated.

Figure 10:
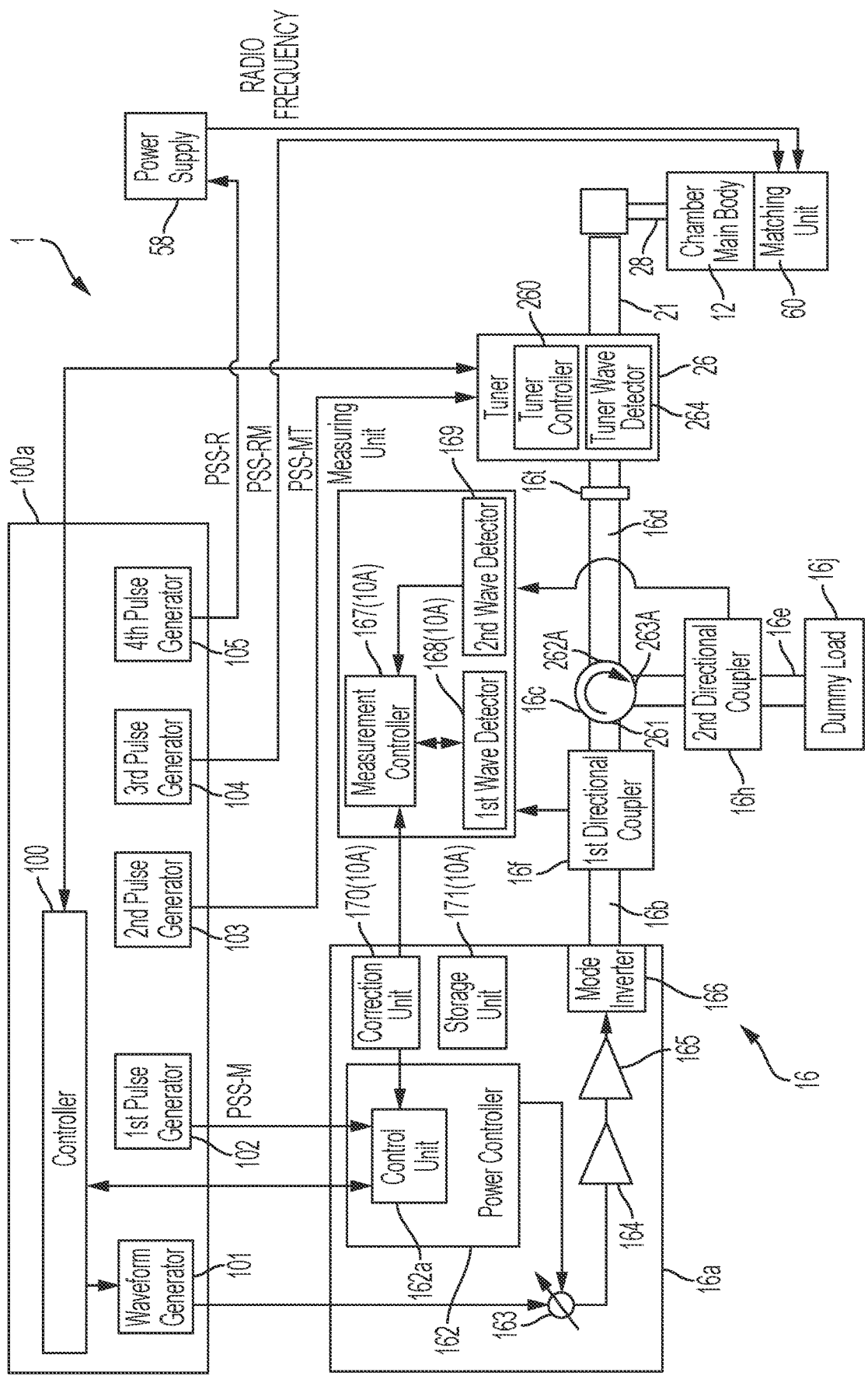
FIG. 10 is a diagram illustrating an example of a microwave output device according to a second embodiment.

FIG. 10 is a diagram illustrating an example of the microwave output device according to the second embodiment. As illustrated in FIG. 10, the microwave generator 16a includes the correction unit 170 and the storage unit 171. The storage unit 171 stores in advance a correspondence relationship between the setting power Pset and a pulse width error. The correction unit 170 corrects a duty ratio acquired by the measurement unit 16k on the basis of the setting power Pset and the correspondence relationship stored in the storage unit 171. As described with reference to FIG. 8, in a case where the travelling wave power Pf is monitored by using the determination threshold value P2, an error occurs in a duty ratio. The error depends on the setting power Pset. Therefore, the correspondence relationship between the setting power Pset and the pulse width error is acquired in advance, and thus a duty ratio is corrected according to the setting power Pset such that it is possible to further improve the accuracy of monitoring a pulse. Remaining configurations other than the configuration are the same as in the first embodiment. The correction unit 170 and the storage unit 171 may be provided not in the microwave generator 16a but in the measurement unit 16k.

Correspondence Relationship Acquisition Process

Figure 11:
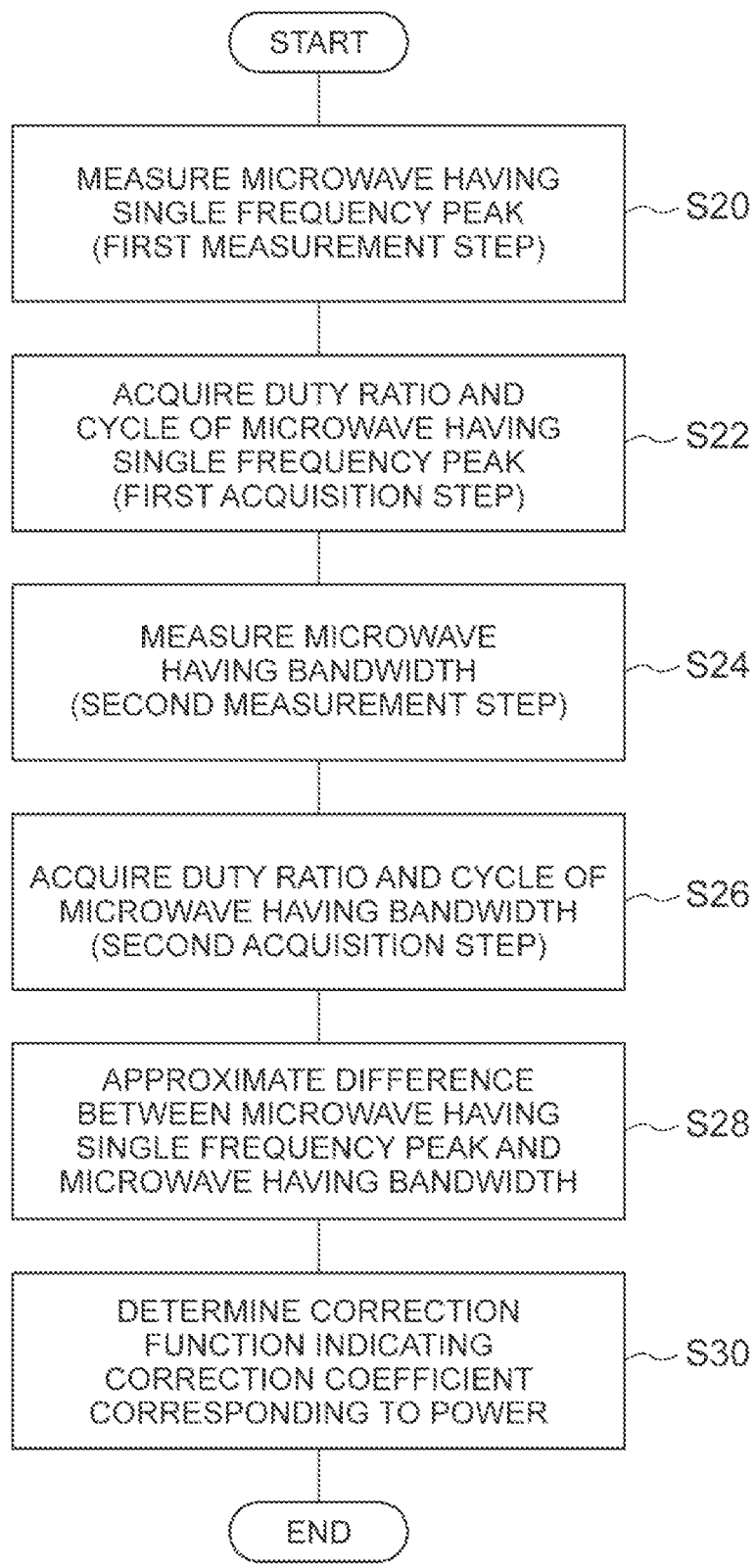
FIG. 11 is a flowchart illustrating an example of a method of determining a correction function.

FIG. 11 is a flowchart illustrating an example of a method of determining a correction function. The flowchart of FIG. 11 is executed, for example, before shipment of the plasma processing apparatus 1 including the microwave monitor device 10A. In execution of the flowchart of FIG. 11, a directional coupler and a dummy load for use in measurement are separately attached to a wave guide tube serving as an output side of the microwave generator 16a of the plasma processing apparatus 1. A travelling wave output of the directional coupler is connected to a peak power analyzer (calibration measuring device), and a power waveform is measured on a time axis.

First, as a first measurement step (step S20), travelling wave power of a microwave having a single frequency peak is measured as a reference by using the peak power analyzer. Herein, travelling wave power corresponding to at least two setting power levels is measured. As an example, first travelling wave power Pf1 which is pulse-modulated such that an ON level corresponds to first setting power Pset1 and second travelling wave power Pf2 which is pulse-modulated such that an ON level corresponds to second setting power Pset2 are measured. The first setting power Pset1 and the second setting power Pset2 may be set to 1000 W or more.

Next, as a first acquisition step (step S22), a duty ratio and a pulse cycle of the travelling wave power of the microwave having the single frequency peak are acquired as references on the basis of the measurement result in the first measurement step (step S20). As an example, a duty ratio of the first travelling wave power Pf1 and a duty ratio of the second travelling wave power Pf2 are acquired on the basis of a measured value in the first measurement step (step S20) and a first determination threshold value for determining an ON level of power. The first determination threshold value is a value corresponding to, for example, 50% of the setting power. In the first acquisition step (step S22), the pulse cycle may not be acquired.

Next, as a second measurement step (step S24), travelling wave power of a microwave having a bandwidth is measured by using the measurement unit 16k. Herein, travelling wave power corresponding to the same setting power as in the first measurement step (step S20) is measured. As an example, third travelling wave power Pf3 which is pulse-modulated such that an ON level corresponds to the first setting power Pset1 and fourth travelling wave power Pf4 which is pulse-modulated such that an ON level corresponds to the second setting power Pset2 are measured.

Next, as a second acquisition step (step S26), a duty ratio and a pulse cycle of the travelling wave power of the microwave having the bandwidth are acquired on the basis of the measurement result in the second measurement step (step S24). As an example, a duty ratio of the third travelling wave power Pf3 and a duty ratio of the fourth travelling wave power Pf4 are acquired on the basis of a measured value in the second measurement step (step S24) and a second determination threshold value for determining an ON level of power. The second determination threshold value is a value in advance which is set in a range more than 0% of the setting power and less than 50% thereof. In the second acquisition step (step S26), the pulse cycle may not be acquired.

Next, as an approximation step (step S28), the duty ratios acquired in the first acquisition step (step S22) and the second acquisition step (step S26) are compared with each other, and thus a pulse width error is calculated. The pulse width error is an error between a pulse width based on a duty ratio which is obtained by using the measured value (the microwave having the single frequency peak) in the peak power analyzer and a pulse width based on a duty ratio which is obtained by using the measured value (the microwave having the bandwidth) in the first wave detector 168. Herein, pulse widths acquired at identical setting power are compared with each other. Specifically, a pulse width error between the first travelling wave power Pf1 and the third travelling wave power Pf3 corresponding to the first setting power Pset1 is acquired. Similarly, a pulse width error between the second travelling wave power Pf2 and the fourth travelling wave power Pf4 corresponding to the second setting power Pset2 is acquired. The pulse width errors are plotted on a coordinate space having the setting power and the pulse width error as coordinate axes, and are approximated with linear functions.

Next, as a determination step (step S30), a correction function is determined on the basis of the linear function obtained in the approximation step (step S28). As an example, the correction function is a function which offsets the pulse width error obtained by using the linear function when the setting power is designated. When the determination step (step S30) is finished, the flowchart of FIG. 11 is finished. A correspondence relationship (the linear function or the correction function) obtained in the above-described way is stored into the storage unit 171, and is referred to by the correction unit 170.

Operation of Microwave Monitor Device

Figure 12:
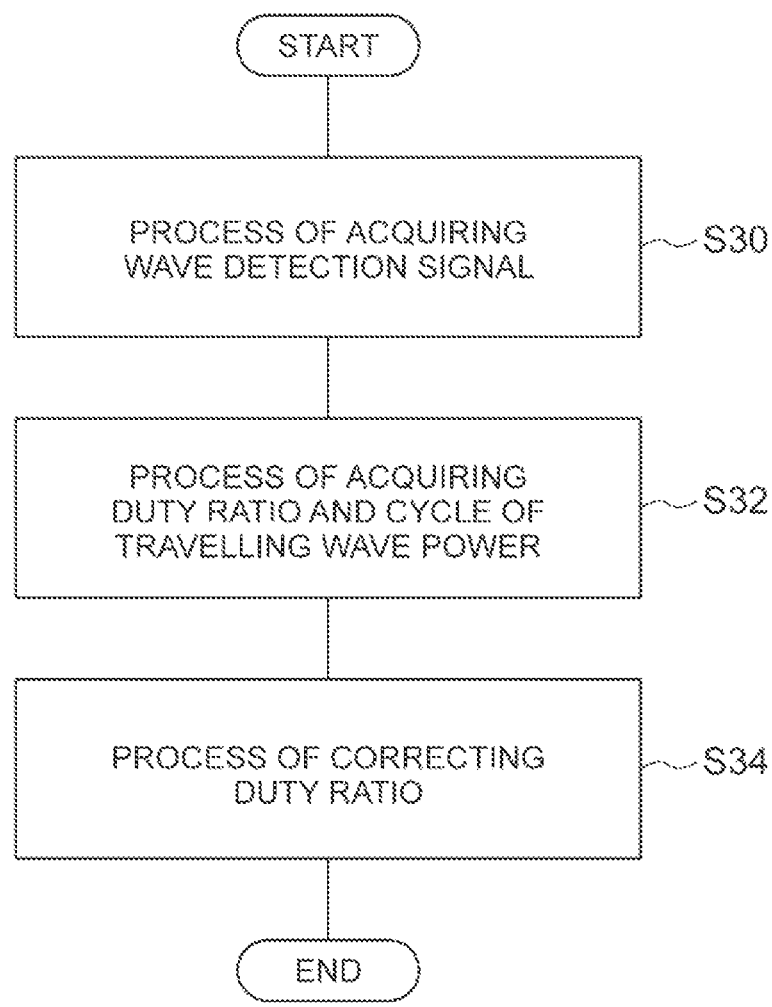
FIG. 12 is a flowchart illustrating an example of an operation of a microwave monitor device.

FIG. 12 is a flowchart illustrating an example of an operation of the microwave monitor device 10A. The flowchart of FIG. 12 is started, for example, when an instruction for turning on a pulse monitor function is input through a worker's operation. As illustrated in FIG. 12, first, the first wave detector 168 of the microwave output device 16 acquires a wave detection signal for the travelling wave power Pf as a wave detection signal acquisition process (step S30) (refer to the signal in FIG. 6D). Next, the measurement controller 167 of the microwave output device 16 acquires a duty ratio and a pulse frequency of the travelling wave power Pf by using the determination threshold value P2 as a pulse information acquisition process (step S32). The determination threshold value P2 is set in advance in a range which is more than 0% of the setting power Pset and is less than 50% thereof. Next, the correction unit 170 of the microwave output device 16 acquires a correction coefficient on the basis of the correspondence relationship stored in the storage unit 171 and the setting power as a duty ratio correction process (step S34). The correction unit 170 corrects the duty ratio acquired in the pulse information acquisition process (step S32) on the basis of the correction coefficient. When the correction process (step S34) is finished, the process illustrated in FIG. 12 is finished. After the flowchart of FIG. 12 is finished, the process illustrated in FIG. 12 may be executed from the beginning again until a finishing condition is satisfied. An example of the finishing condition is the time at which, for example, an instruction for turning off the pulse monitor function is input through a worker's operation.

Summary of Second Embodiment

In a case where the second determination threshold value for an ON level of a microwave having a bandwidth is less than 50%, there is concern that an error occurs in a duty ratio. The microwave monitor device 10A can correct a pulse width as a measurement result according to setting power. Thus, it is possible to improve the accuracy of monitoring a pulse. At least two pieces of data are used, and thus it is possible to determine a correction function for correcting a pulse width error with respect to any setting power.

As mentioned above, various embodiments have been described, but the present disclosure is not limited to the embodiments, and may be variously modified.

In the embodiments, a description has been made of an example in which the microwave generator 16a and the waveform generator 101 are separately configured, but the microwave generator 16a and the waveform generator 101 may be configured as a single device. A description has been made of an example in which the calculation device 100a includes the first pulse generator 102 to the fourth pulse generator 105, but this is only an example. For example, the power controller 162 may include the first pulse generator 102.

In a case where the plasma processing apparatus employs only a mode using travelling wave power of a microwave, the measurement unit 16k may not have a configuration of measuring a reflected wave.

EXAMPLES

Hereinafter, a description will be made of simulation results for explaining effects of the present disclosure.

Duty Ratio Error

A duty ratio error was simulated. As simulation conditions, the setting power Pset was 500 W to 2700 W, and a bandwidth was 10 MHz. A setting duty ratio for pulse modulation was 10%, 20%, 30%, 40%, 50%, 60%, 70%, 80%, and 90%, and a setting pulse frequency was 1 kHz, 2 kHz, 3 kHz, 4 kHz, 5 kHz, 6 kHz, 7 kHz, 8 kHz, 9 kHz, 10 kHz, 12 kHz, 14 kHz, 16 kHz, 18 kHz, and 20 kHz. A pulse modulation method was ON/OFF modulation. A duty ratio was calculated by using the first determination threshold value P1 and the second determination threshold value P2 described with reference to FIG. 8. The first determination threshold value P1 was set to 50% of the setting power, and the second determination threshold value P2 was set to 0.4% of the setting power. Results thereof are shown in FIGS. 13A to 13F, and FIGS. 14A to 14F. Hereinafter, a microwave having a single frequency peak will be described as a single peak mode (SP mode), and a microwave having a bandwidth will be described as a broadband mode (BB mode).

Figure 13A:
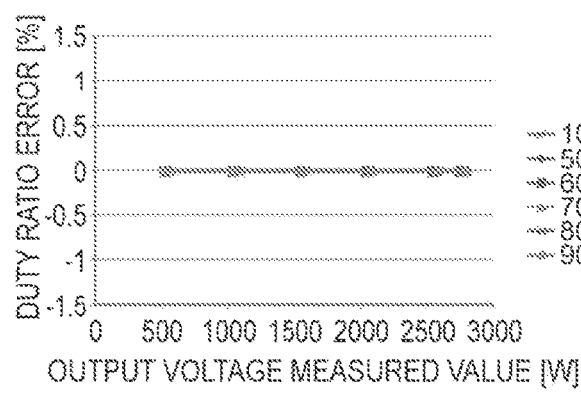
FIGS. 13A to 13F are exemplary diagrams illustrating measurement results of the dependence of a duty ratio error of a microwave having a single frequency peak on an output voltage, and measurement results of the dependence of a duty ratio error of a microwave having a bandwidth on an output voltage.
Figure 13B:
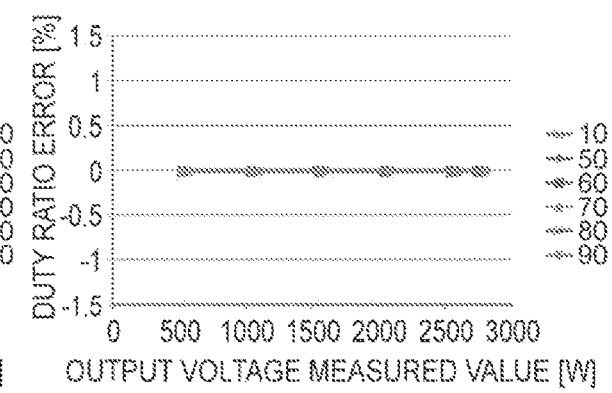
Figure 13C:
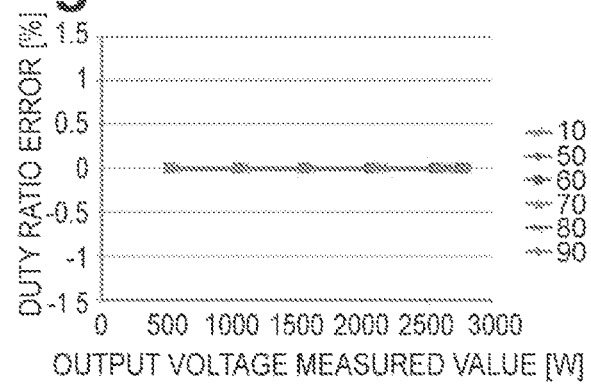
Figure 13D:
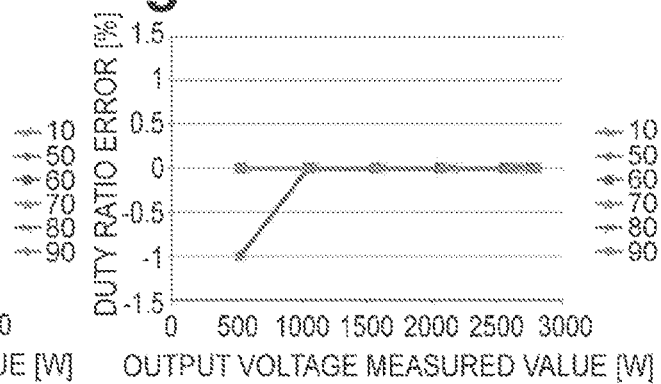

In FIGS. 13A to 13F, a transverse axis expresses an output voltage measured value (corresponding to the setting power), and a longitudinal axis expresses a duty ratio error. The error in each of FIGS. 13A to 13F is an error of a measured value in the measurement unit 16k with respect to the setting duty ratio, and is a display monitor value derived by subtracting the setting value from the measured value and further by rounding off the first decimal point. FIG. 13A illustrates a simulation result in the SP mode at the pulse frequency of 9 kHz, and FIG. 13B illustrates a simulation result in the BB mode at the pulse frequency of 9 kHz. FIG. 13C illustrates a simulation result in the SP mode at the pulse frequency of 10 kHz, and FIG. 13D illustrates a simulation result in the BB mode at the pulse frequency of 10 kHz. FIG.

Figure 13E:
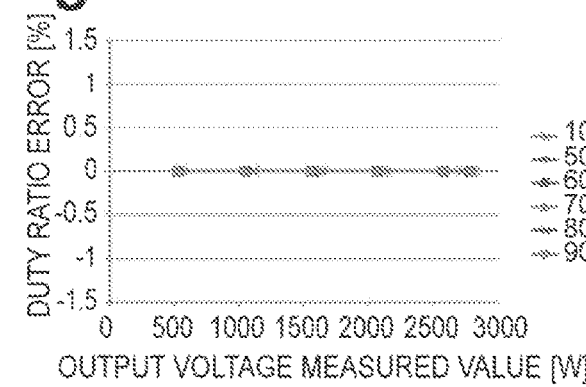
Figure 13F:
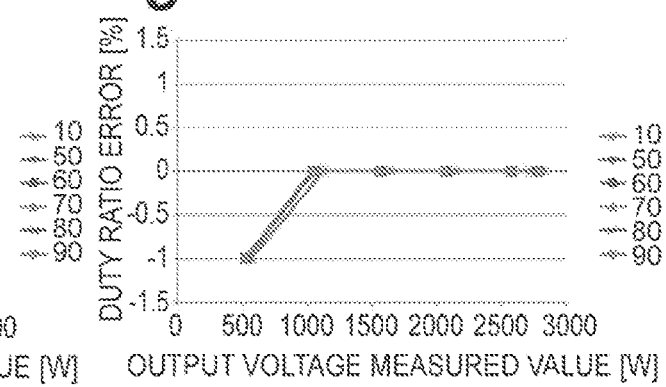

13E illustrates a simulation result in the SP mode at the pulse frequency of 20 kHz, and FIG. 13F illustrates a simulation result in the BB mode at the pulse frequency of 20 kHz. In each simulation, an error was simulated for each duty ratio.

As illustrated in FIGS. 13A, 13C, and 13E, a duty ratio error was not recognized in a case of the SP mode. As illustrated in FIG. 13B, an error was not recognized either at the pulse frequency of 9 kHz in a case of the BB mode. However, in a case of the BB mode, as illustrated in FIGS. 13D and 13F, errors were recognized at the pulse frequencies of 10 kHz and 20 kHz. Specifically, an error of 1% was recognized at the output value measured value of 500 W and the pulse frequency of 10 kHz or more. As mentioned above, in a case of the BB mode, it was checked that an error occurs compared with the SP mode even in a case of using the second determination threshold value P2.

Figure 14A:
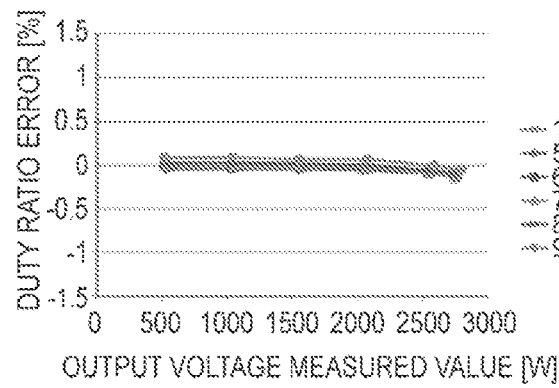
FIGS. 14A to 14F are exemplary diagrams illustrating measurement results of the dependence of a duty ratio error of a microwave having a single frequency peak on an output voltage, and measurement results of the dependence of a duty ratio error of a microwave having a bandwidth on an output voltage.
Figure 14B:
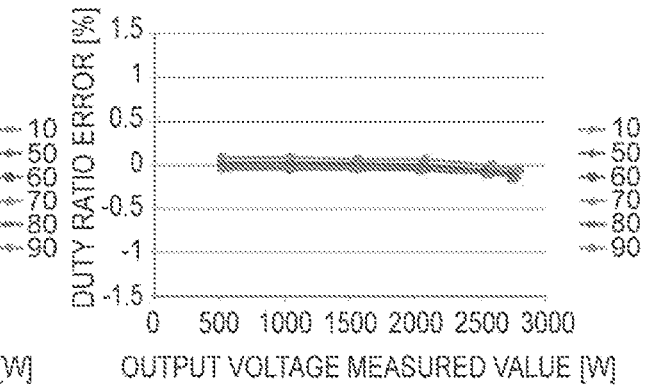
Figure 14C:
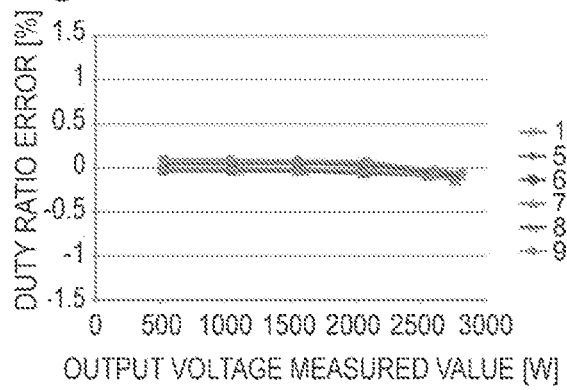
Figure 14D:
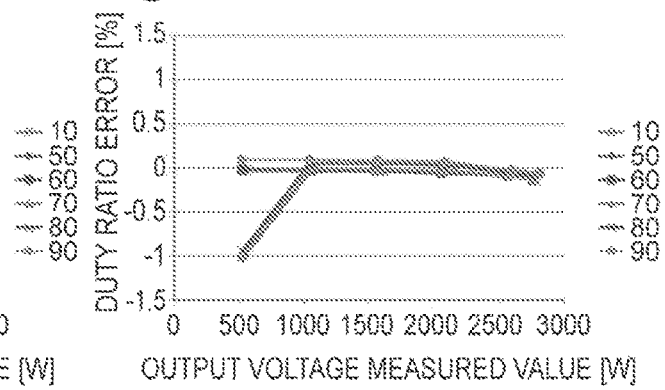
Figure 14E:
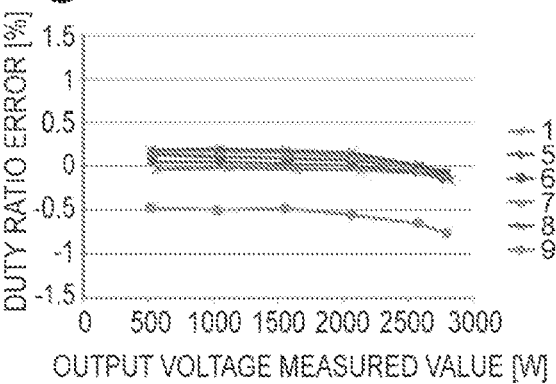
Figure 14F:
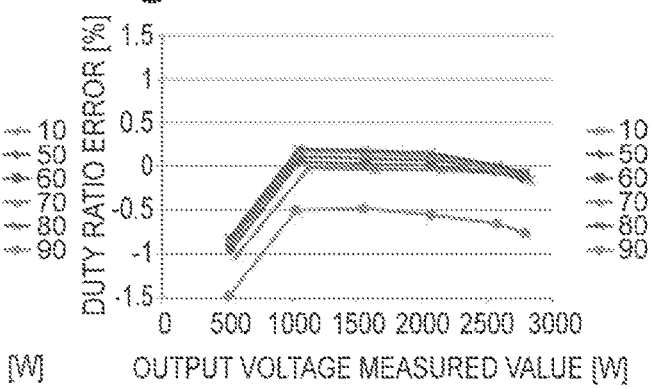

In FIGS. 14A to 14F, a transverse axis expresses an output voltage measured value (corresponding to the setting power), and a longitudinal axis expresses a duty ratio error. The error in each of FIGS. 14A to 14F is an error of a measured value in the measurement unit 16k with respect to a measured value in the peak power analyzer, and is derived by subtracting the measured value in the peak power analyzer from the measured value in the measurement unit 16k. FIG. 14A illustrates a simulation result in the SP mode at the pulse frequency of 9 kHz, and FIG. 14B illustrates a simulation result in the BB mode at the pulse frequency of 9 kHz. FIG. 14C illustrates a simulation result in the SP mode at the pulse frequency of 10 kHz, and FIG. 14D illustrates a simulation result in the BB mode at the pulse frequency of 10 kHz. FIG. 14E illustrates a simulation result in the SP mode at the pulse frequency of 20 kHz, and FIG. 14F illustrates a simulation result in the BB mode at the pulse frequency of 20 kHz. In each simulation, an error was simulated for each duty ratio.

As illustrated in FIGS. 14A, 14C, and 14E, in a case of the SP mode, it was checked that a duty ratio error is within 0.5% up to a duty ratio of 80%, and thus an error does not substantially occur. However, in FIG. 14E, an error was 0.5% or less when a duty ratio was 90%. As illustrated in FIG. 14B, an error was not recognized either at the pulse frequency of 9 kHz in a case of the BB mode. However, in a case of the BB mode, as illustrated in FIGS. 14D and 14F, errors were recognized at the pulse frequencies of 10 kHz and 20 kHz. Specifically, an error of 1% was recognized at the output value measured value of 500 W and the pulse frequency of 10 kHz or more. As mentioned above, in a case of the BB mode, it was checked that an error occurs compared with the SP mode even in a case of using the second determination threshold value P2. It was checked that an error increases as an output voltage measured value increases.

Figure 15A:
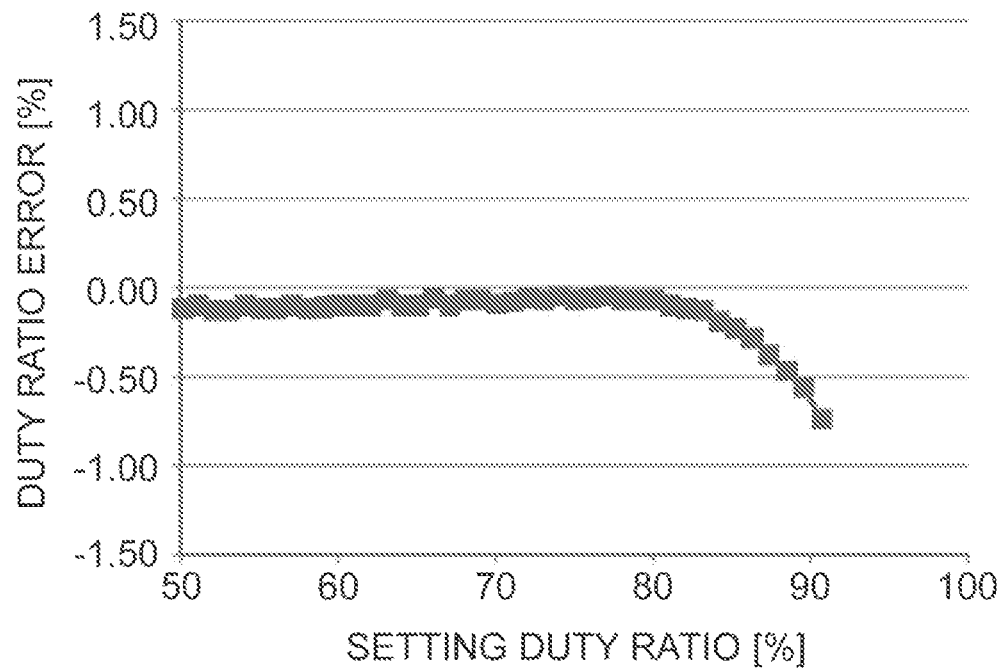
FIGS. 15A and 15B are exemplary diagrams illustrating a measurement result of a duty ratio error with respect to a setting duty ratio of a microwave having a bandwidth and a measurement result of a duty ratio error with respect to a setting pulse frequency.
Figure 15B:
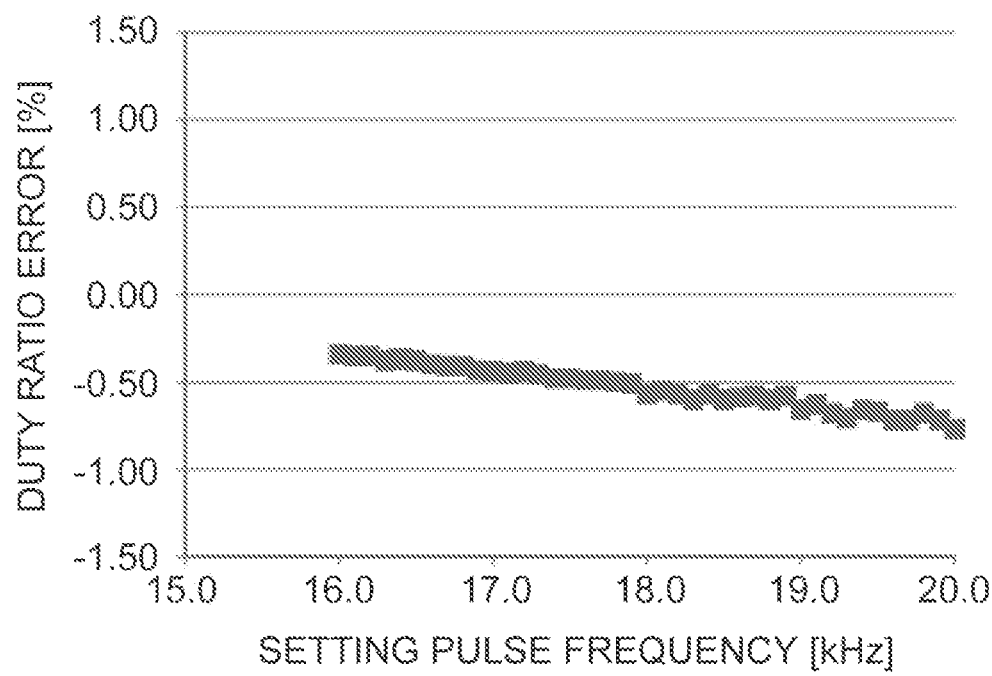
Figure 16B:
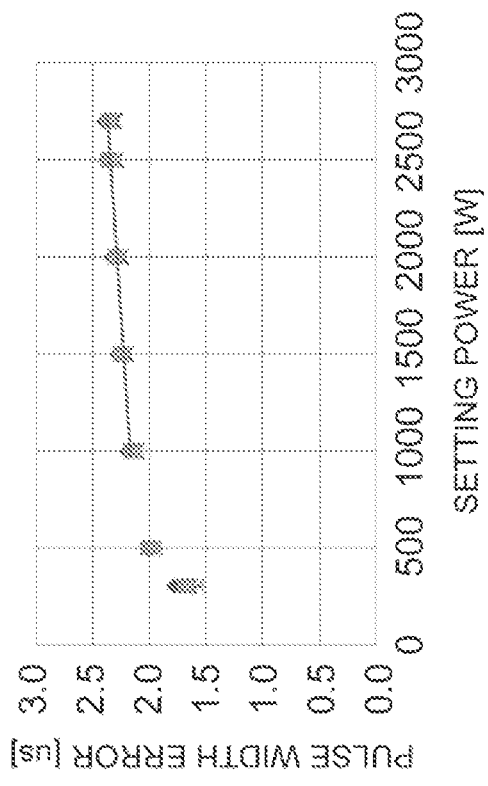
FIGS. 16A to 16D are exemplary diagrams illustrating measurement results of a pulse width error with respect to setting power.
Figure 16D:
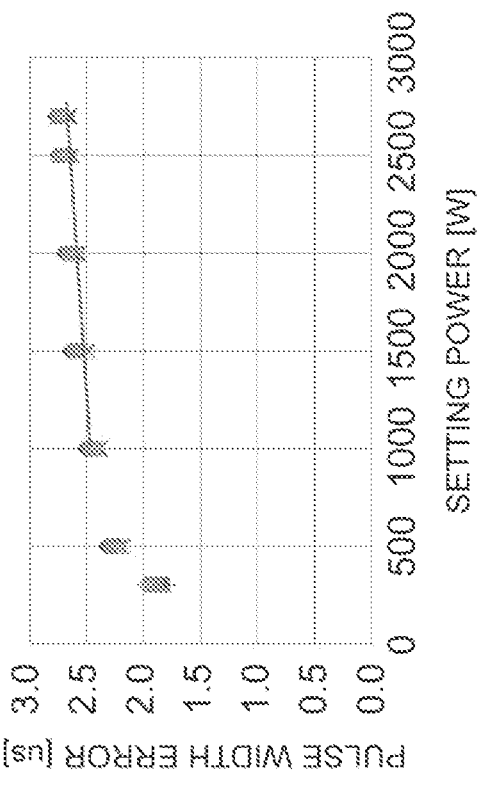
Figure 16A:
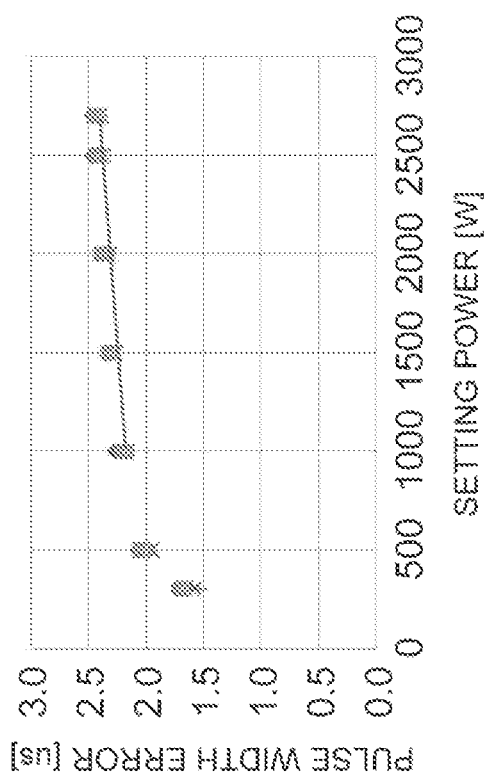
Figure 16C:
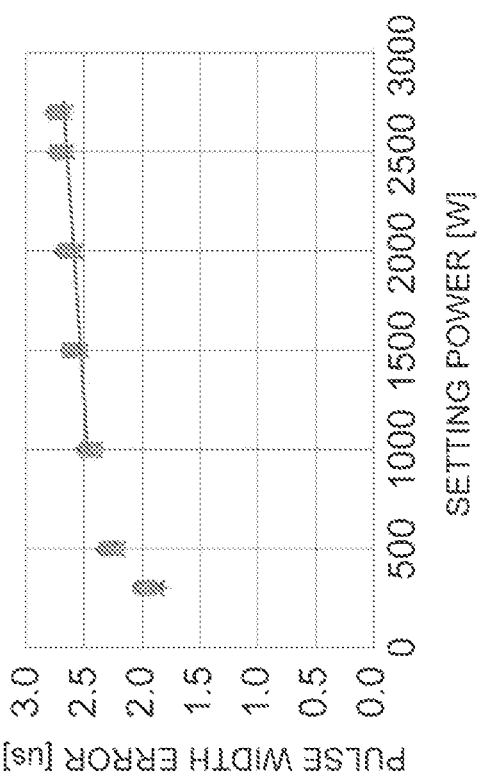
Figure 17A:
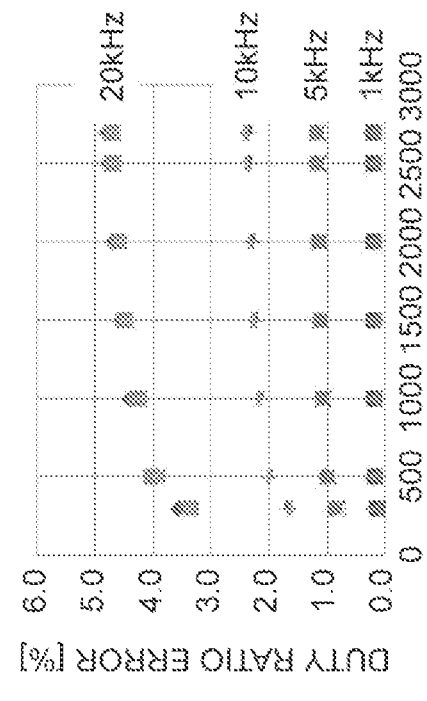
FIGS. 17A to 17D are exemplary diagrams illustrating measurement results of a duty ratio error with respect to setting power, obtained by using a duty ratio before being corrected.
Figure 17B:
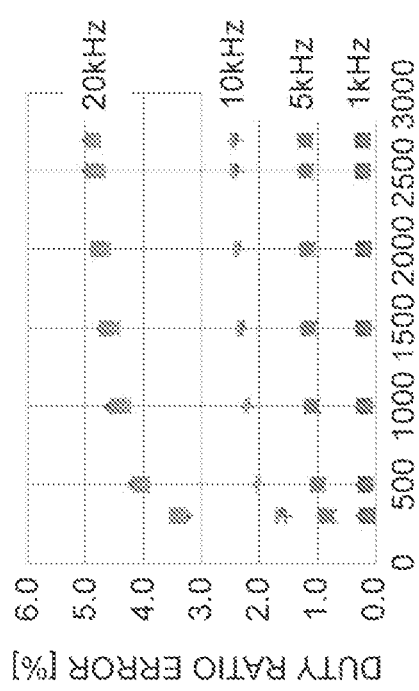
Figure 17D:
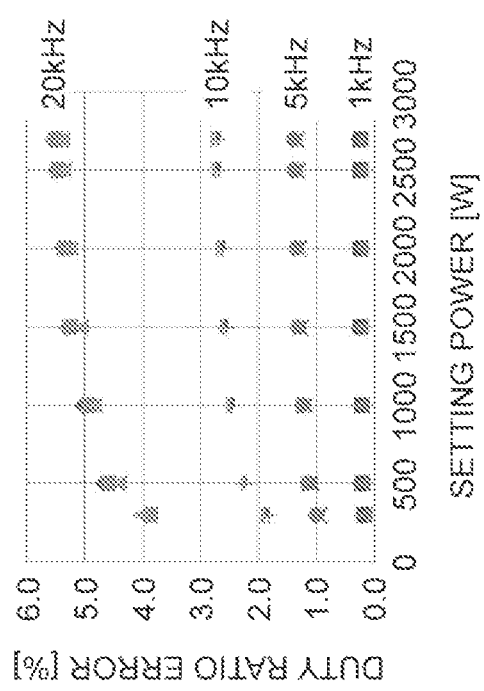
Figure 17C:
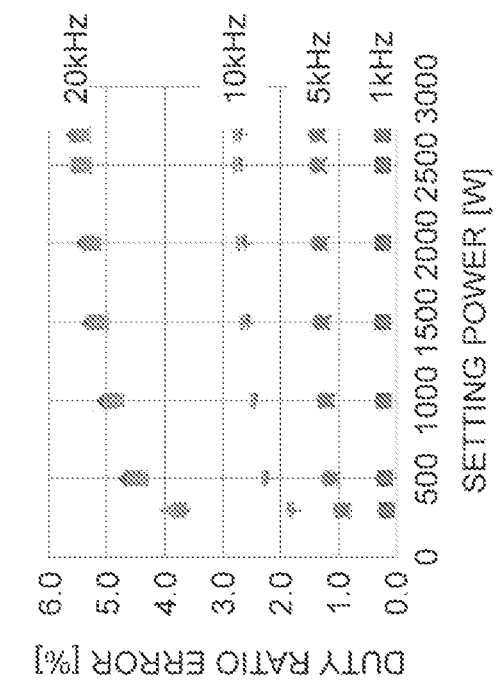

FIG. 15A is a graph in which the data shown in FIG. 14F is subjected to coordinate conversion and a duty ratio is cut by 1%, in which a transverse axis expresses a setting duty ratio, and a longitudinal axis expresses an error. As illustrated in FIG. 15A, in the BB mode, it was checked that an error increases as a setting duty ratio increases. FIG. 15B is a graph in which the data of the duty ratio of 90% shown in FIGS. 14B, 14D, and 14F is plotted again, and a pulse frequency is set to 0.1 kHz, in which a transverse axis expresses a setting pulse frequency, and a longitudinal axis expresses an error. As illustrated in FIG. 15B, in the BB mode, it was checked that an error increases as a setting pulse frequency increases.

Next, a pulse width error was simulated. As simulation conditions, the setting power Pset was 500 W to 2700 W, and a bandwidth was 10 MHz. A setting duty ratio for pulse modulation was 10%, 50%, and 90%, and a setting pulse frequency was 1 kHz, 5 kHz, 10 kHz, and 20 kHz. A pulse modulation method was ON/OFF modulation. A duty ratio was calculated by using the first determination threshold value P1 and the second determination threshold value P2 described with reference to FIG. 8. The first determination threshold value P1 was set to 50% of the setting power, and the second determination threshold value P2 was set to 0.4% of the setting power. Pulse width errors were measured in the four measurement units 16k under the conditions. Results thereof are shown in FIGS. 16A to 16D.

FIGS. 16A to 16D respectively illustrate simulation results in the four measurement units 16k, in which a transverse axis expresses setting power, and a longitudinal axis expresses a pulse width error. As illustrated in FIGS. 16A to 16D, there is an individual difference for each measurement unit 16k, but it was checked that a pulse width error increases depending on the setting power. It was checked that the pulse width error monotonously increases in a region of the setting power of 1000 W or more. In other words, it was checked that the pulse width error can be approximated with a linear function in the region of the setting power of 1000 W or more (refer to a straight line in the figure). Therefore, it was checked that a correspondence relationship between any setting power and a pulse width error can be derived by using a linear function.

Checking of Improvement of Pulse Monitor Accuracy

FIGS. 17A to 17D illustrate results measured by the measurement units 16k corresponding to FIGS. 16A to 16D, in which a transverse axis expresses setting power, and a longitudinal axis expresses a duty ratio error. In FIGS. 17A to 17D, a setting pulse frequency was 1 kHz, 5 kHz, 10 kHz, and 20 kHz. As illustrated in FIGS. 17A to 17D, it was checked that there is a maximum error of about 5%. FIGS. 18A to 18D illustrate results of correcting the data in FIGS. 17A to 17D by using the linear functions illustrated in FIGS. 16A to 16D.

FIGS. 18A to 18D illustrate results of correcting the data in FIGS. 17A to 17D, in which a transverse axis expresses setting power, and a longitudinal axis expresses a duty ratio error. Correction data was calculated through linear approximation under conditions that a setting pulse frequency was 5 kHz, a duty ratio for pulse modulation was 90%, and setting power was 1000 W and 2500 W. As illustrated in FIGS. 18A to 18D, it was checked that a duty ratio error is suppressed to 1% or less at the setting power of 500 W or more when the setting pulse frequency is 1 kHz, 5 kHz, 10 kHz, and 20 kHz. Particularly, an error was improved not to be recognized in a range of the setting power of 1000 W or more.

What is claimed is:

1. A method of determining a correction function for correcting a measurement result from a wave detector detecting a microwave which is pulse-modulated such that power of the microwave is turned on and off, the method comprising:

measuring first travelling wave power of a microwave of which power is pulse-modulated such that an ON level corresponds to first setting power and which has a single frequency peak and second travelling wave power of a microwave of which power is pulse-modulated such that an ON level corresponds to second setting power and which has a single frequency peak, by using a calibration measuring device;

acquiring a duty ratio of the first travelling wave power and a duty ratio of the second travelling wave power on the basis of measured values in the measuring by using the calibration measuring device and a first determination threshold value for determining an ON level of power;

measuring third travelling wave power of a microwave of which power is pulse-modulated such that an ON level corresponds to the first setting power and which has a center frequency and a bandwidth and fourth travelling wave power of a microwave of which power is pulse-modulated such that an ON level corresponds to the second setting power and which has a center frequency and a bandwidth, by using the wave detector;

acquiring a duty ratio of the third travelling wave power and a duty ratio of the fourth travelling wave power on the basis of measured values in the measuring by using the wave detector and a second determination threshold value, set in advance in a range more than 0% of the setting power and less than 50% of the setting power, for determining an ON level of power;

approximating a pulse width error between the first travelling wave power and the third travelling wave power corresponding to the first setting power and a pulse width error between the second travelling wave power and the fourth travelling wave power corresponding to the second setting power with linear functions by setting, as coordinate axes, the setting power, and a pulse width error which is an error between a pulse width based on a duty ratio obtained by using a measured value in the calibration measuring device and a pulse width based on a duty ratio obtained by using a measured value in the wave detector; and determining the correction function on the basis of the linear functions.

2. The method of determining a correction function according to claim 1, wherein the first setting power and the second setting power are equal to or more than 1000 W.

* * * * *